US010540045B2

United States Patent
Shingai et al.

(10) Patent No.: US 10,540,045 B2
(45) Date of Patent: Jan. 21, 2020

(54) TRANSPARENT CONDUCTOR, METHOD FOR PRODUCING SAME, AND TOUCH PANEL

(71) Applicant: TDK CORPORATION, Tokyo (JP)

(72) Inventors: Hiroshi Shingai, Tokyo (JP); Yoshihisa Tamagawa, Tokyo (JP); Motohiro Sakurai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 171 days.

(21) Appl. No.: 15/567,918

(22) PCT Filed: Apr. 22, 2016

(86) PCT No.: PCT/JP2016/062786
§ 371 (c)(1),
(2) Date: Oct. 19, 2017

(87) PCT Pub. No.: WO2016/171260
PCT Pub. Date: Oct. 27, 2016

(65) Prior Publication Data
US 2018/0113529 A1 Apr. 26, 2018

(30) Foreign Application Priority Data
Apr. 24, 2015 (JP) .................. 2015-089524

(51) Int. Cl.
*B32B 3/00* (2006.01)
*G06F 3/044* (2006.01)
(Continued)

(52) U.S. Cl.
CPC ................ *G06F 3/044* (2013.01); *B32B 9/00* (2013.01); *B32B 15/08* (2013.01); *C23F 1/00* (2013.01);
(Continued)

(58) Field of Classification Search
CPC ......... G06F 3/041; G06F 3/044; B32B 9/041; B32B 15/08; H01B 5/14; H01B 13/00; H05K 1/0274
See application file for complete search history.

(56) References Cited

U.S. PATENT DOCUMENTS

2013/0113757 A1  5/2013  Tanaka et al.
2015/0053466 A1  2/2015  Ho et al.

FOREIGN PATENT DOCUMENTS

EP  2 648 079 A1  10/2013
JP  H05-002173 A  1/1993
(Continued)

OTHER PUBLICATIONS

Oct. 24, 2017 International Preliminary Report on Patentability issued in International Patent Application No. PCT/JP2016/062786.
(Continued)

*Primary Examiner* — Elizabeth E Mulvaney
(74) *Attorney, Agent, or Firm* — Oliff PLC

(57) ABSTRACT

The transparent conductor involves a first laminate part including a transparent resin substrate and a transmittance-controlling layer, and a second laminate part including the transparent resin substrate, the transmittance-controlling layer, a metal layer containing silver or a silver alloy, and a metal oxide layer in the order presented. The first laminate part and the second laminate part are adjacent to each other in a direction perpendicular to the direction of lamination of the first laminate part and the second laminate part, and the difference between the transmittance of the first laminate part in the direction of lamination, T1, and the transmittance of the second laminate part in the direction of lamination, T2, (T2−T1) is 4% or more.

20 Claims, 11 Drawing Sheets

(51) Int. Cl.
| | |
|---|---|
| *B32B 15/08* | (2006.01) |
| *H01B 5/14* | (2006.01) |
| *H01B 13/00* | (2006.01) |
| *B32B 9/00* | (2006.01) |
| *G06F 3/041* | (2006.01) |
| *H05K 1/02* | (2006.01) |
| *H05K 1/09* | (2006.01) |
| *C23F 1/00* | (2006.01) |
| *H05K 1/03* | (2006.01) |

(52) U.S. Cl.
CPC .............. *G06F 3/041* (2013.01); *H01B 5/14* (2013.01); *H01B 13/00* (2013.01); *H05K 1/0274* (2013.01); *H05K 1/09* (2013.01); *B32B 2307/202* (2013.01); *B32B 2307/412* (2013.01); *B32B 2307/418* (2013.01); *B32B 2457/208* (2013.01); *G06F 2203/04103* (2013.01); *H01B 13/0036* (2013.01); *H05K 1/0289* (2013.01); *H05K 1/0313* (2013.01); *H05K 2201/0108* (2013.01); *H05K 2201/0338* (2013.01)

(56) References Cited

FOREIGN PATENT DOCUMENTS

| | | |
|---|---|---|
| JP | 2002-157929 A | 5/2002 |
| JP | 2014-191934 A | 10/2014 |

OTHER PUBLICATIONS

Jun. 28, 2016 International Search Report issued in International Patent Application No. PCT/JP2016/062786.

Dec. 17, 2018 Extended European Search Report in European Patent Application No. 16783281.5.

TRANSPARENT CONDUCTOR, METHOD FOR PRODUCING SAME, AND TOUCH PANEL

TECHNICAL FIELD

The present disclosure relates to a transparent conductor and a method for producing the same, and a touch panel using the transparent conductor.

BACKGROUND ART

Transparent conductors are used for displays such as liquid crystal displays (LCDs), plasma display panels (PDPs), and electroluminescence panels (organic EL, inorganic EL), and transparent electrodes for solar cells or the like. In addition, transparent conductors are used for electromagnetic insulation films and infrared shield film. For a material of a metal oxide layer of a transparent conductor, ITO, which is a substance obtained by adding tin (Sn) to indium oxide ($In_2O_3$), is widely used.

Terminals provided with a touch panel such as smartphones and tablet terminals have been rapidly spreading in recent years. They have a configuration in which a touch sensor part is provided on a liquid crystal panel, and a cover glass is provided on the outermost surface. The touch sensor part is configured with one sheet or two sheets pasted together, each sheet being obtained by forming an ITO film through sputtering on one surface or both surfaces of a glass or a substrate for a film.

In association with upsizing of touch panels and achievement of highly precise touch sensor function, a transparent conductor having a high transmittance and low resistance has been required. It is required for lowering of the resistance of a transparent conductor with an ITO film to thicken the ITO film or to crystallize the ITO film through thermal annealing. However, thickening of the ITO film leads to lowering of the transmittance. In addition, it is typically difficult to perform thermal annealing for a substrate for a film at high temperature. Thus, it is currently difficult to lower the resistance of an ITO film provided on a substrate for a film while the transmittance is kept high.

In such circumstances, a transparent conductive film having a laminate structure of a metal oxide layer containing a component different from ITO and a metal layer has been proposed (e.g., Patent Literature 1).

CITATION LIST

Patent Literature

Patent Literature 1: Japanese Unexamined Patent Publication No. 2002-157929

SUMMARY OF INVENTION

Technical Problem

For use as a touch panel or the like, a patterning process is performed to form a conductive part and an insulating part in a transparent conductor so that a touched position can be detected. After the conductive part and the insulating part are formed, they are covered with a glass layer, and thus a touch panel or the like is manufactured. Since a conductive part and an insulating part in a transparent conductive film with ITO are almost equivalent in terms of optical properties, almost no shading is caused to the pattern. In addition, a conductive part and an insulating part in a transparent conductive film with ITO are almost equivalent in terms of optical properties both in the state before being covered with a glass layer (a state of a film) and in the state after being covered with a glass layer.

In the case of a transparent conductor in which metal oxide layers are laminated with a metal layer sandwiched therebetween, however, total removal of the metal layer and the metal oxide layers sandwiching the metal layer by etching in a patterning process causes shading to the pattern because the transmittance of the conductive part before etching and the transmittance of the insulating part after etching are different. The transmittance of each of the conductive part and the insulating part is different between the state before being covered with a glass layer and the state after being covered with a glass layer, as a result of which, even when the transmittance difference between the conductive part and the insulating part before being covered with a glass layer is set small, the transmittance difference becomes larger after being covered with a glass layer to cause shading to the pattern.

In view of this, an object of the present invention is, in one aspect, to provide a transparent conductor having a laminate structure of a metal oxide layer and a metal layer, the transparent conductor being capable of sufficiently preventing generation of shading due to a difference in transmittance difference between a conductive part and an insulating part. Another object of the present invention is, in another aspect, to provide a production method capable of producing such a transparent conductor at high productivity. Still another object of the present invention is, in still another aspect, to provide a touch panel with shading due to a difference in transmittance between a conductive part and an insulating part sufficiently reduced.

Solution to Problem

The present invention provides, in one aspect, a transparent conductor comprising a transparent resin substrate, wherein the transparent conductor comprises: a first laminate part including the transparent resin substrate and a transmittance-controlling layer; and a second laminate part including the transparent resin substrate, the transmittance-controlling layer, a metal layer containing silver or a silver alloy, and a metal oxide layer in the order presented, the first laminate part and the second laminate part are adjacent to each other in a direction perpendicular to the direction of lamination of the first laminate part and the second laminate part, and the difference between the transmittance of the first laminate part in the direction of lamination, T1, and the transmittance of the second laminate part in the direction of lamination, T2, (T2−T1) is 4% or more.

The transparent conductor includes a transmittance-controlling layer, not only in the second laminate part which is to function as a conductive part, but also in the first laminate part which is to function as an insulating part. The configuration in which the transmittance-controlling layer is provided can provide a larger difference in transmittance between the first laminate part and the second laminate part in the direction of lamination (T2−T1) to 4% or more. If a glass layer is provided to cover the transmittance-controlling layer in the first laminate part and the metal oxide layer in the second laminate part, then the transmittance of the first laminate part becomes higher to approach the transmittance of the second laminate part. Thus, by making a difference in transmittance (T2−T1) in advance in the state before being covered with the glass layer, the difference in transmittance between a conductive part and a part without a conductive part, namely, an insulating part, after providing the glass layer can be decreased. Accordingly, generation of shading due to the shape of a conductive part and insulating part can be sufficiently prevented. The transparent conductor can be suitably used for applications requiring high image quality, such as touch panels.

The T2 may be 80% or higher. This provides a transparent conductor having high transmittance, and thus a transparent conductor can be obtained which is particularly suitable for applications requiring reduction of shading in a pattern of a conductive part and insulating part as much as possible, such as touch panels.

In some embodiments, the refractive index of the transmittance-controlling layer may be 1.8 to 2.5 and the refractive index of the metal oxide layer may be 1.8 to 2.3. The configuration in which the transmittance-controlling layer having such a refractive index is included can further decrease the difference in transmittance between a conductive part (fourth laminate part) and an insulating part (third laminate part) after the glass layer is provided, while a sufficiently high transmittance is imparted to each of them. Thereby, the image quality can be further enhanced while shading is further reduced.

In some embodiments, the first laminate part and the second laminate part may each include a high refractive index layer between the transparent resin substrate and the transmittance-controlling layer. In this case, the refractive index of the high refractive index layer may be 1.55 to 1.8. The configuration in which the high refractive index layer is provided can further decrease the difference in transmittance for wavelengths of 450 nm to 650 nm.

In some embodiments, the first laminate part and the second laminate part may each include, between the transparent resin substrate and the transmittance-controlling layer, a low refractive index layer and a high refractive index layer in the order presented from the transparent resin substrate side. In this case, the refractive index of the high refractive index layer may be 1.55 to 1.8, and the refractive index of the low refractive index layer may be lower than the refractive index of the high refractive index layer and be 1.4 to 1.6. The configuration in which the high refractive index layer and low refractive index layer are provided in combination can further decrease the transmittance difference for the entire visible light region.

In some embodiments, the first laminate part and the second laminate part may each include a hardcoat layer in the side opposite to the transmittance-controlling layer side of the transparent resin substrate. The configuration in which the hardcoat layer is included can sufficiently prevent generation of a scratch in the transparent resin substrate.

In some embodiments, the transmittance-controlling layer may contain at least one of zinc oxide and tin oxide. The metal oxide layer may have a composition different from the composition of the transmittance-controlling layer and contain at least one selected from the group consisting of zinc oxide, gallium oxide, germanium oxide, indium oxide, titanium oxide, and tin oxide.

In some embodiments, the first laminate part and the second laminate part may be formed by partially etching the metal layer and the metal oxide layer, without removing the transmittance-controlling layer through the etching. The transparent conductor to be formed in this manner can be produced at high productivity.

In some embodiments, in the transparent conductor, the first laminate part and the second laminate part may each include a glass layer in the side opposite to the transparent resin substrate side, and the transmittance of a third laminate including the first laminate part and the glass layer in the direction of lamination, T3, may be 90% or lower, and the transmittance of a fourth laminate part including the second laminate part and the glass layer in the direction of lamination, T4, may be 85% or higher.

The configuration in which the transmittance of the third laminate part including an insulating part, T3, is 90% or lower can provide a sufficiently small absolute value of the difference in transmittance between the third laminate part and the fourth laminate part including a conductive part, |T4−T3|. Thereby, a transparent conductor with shading due to the difference in transmittance between a conductive part and an insulating part sufficiently reduced can be obtained.

In some embodiments, the absolute value of the difference between the transmittance T3 and the transmittance T4 (T4−T3) may be 1% or less. Thereby, shading due to the difference in transmittance between a conductive part and an insulating part can be further reduced.

The present invention provides, in another aspect, a transparent conductor comprising a transparent resin substrate, wherein the transparent conductor is obtained by etching a laminate including the transparent resin substrate, a transmittance-controlling layer, a metal layer containing silver or a silver alloy, and a metal oxide layer in the order presented to remove a part of the metal layer and the metal oxide layer, without removing the transmittance-controlling layer, the transparent conductor comprises a first laminate part including the transparent resin substrate and a transmittance-controlling layer and a second laminate part including the transparent resin substrate, the transmittance-controlling layer, a metal layer containing silver or a silver alloy, and a metal oxide layer in the order presented, and the first laminate part and the second laminate part are adjacent to each other in a direction perpendicular to the direction of lamination of the first laminate part and the second laminate part. The transparent conductor can sufficiently prevent generation of shading due to the difference in transmittance between a conductive part and an insulating part.

The present invention provides, in still another aspect, a transparent conductor comprising a transparent resin substrate, wherein the transparent conductor comprises: a third laminate part including the transparent resin substrate, a transmittance-controlling layer, and a glass layer in the order presented; and a fourth laminate part including the transparent resin substrate, the transmittance-controlling layer, a metal layer containing silver or a silver alloy, a metal oxide layer, and the glass layer in the order presented, the third laminate part and the fourth laminate part are adjacent to each other in a direction perpendicular to the direction of lamination of the third laminate part and the fourth laminate part, the transmittance of the third laminate part in the direction of lamination, T3, is 90% or lower, and the transmittance of the fourth laminate part in the direction of lamination, T4, is 85% or higher.

The transparent conductor can have a sufficiently small absolute value of the difference between the transmittance of the third laminate part including an insulating part, T3, and the transmittance of the fourth laminate part including a conductive part, T4. Accordingly, generation of shading can be sufficiently prevented. The transparent conductor can be suitably used for applications requiring high image quality, such as touch panels.

The present invention provides, in still another aspect, a transparent conductor comprising a transparent resin substrate, wherein the transparent conductor comprises: a third laminate part including the transparent resin substrate, a transmittance-controlling layer, and a glass layer in the order presented; and a fourth laminate part including the transparent resin substrate, the transmittance-controlling layer, a metal layer containing silver or a silver alloy, a metal oxide layer, and the glass layer in the order presented, the third laminate part and the fourth laminate part are adjacent to each other in a direction perpendicular to the direction of lamination of the third laminate part and the fourth laminate part, and the transmittance-controlling layer is an insulating layer. The transparent conductor can sufficiently prevent generation of shading due to the difference in transmittance between a conductive part and an insulating part.

The present invention provides, in still another aspect, a touch panel comprising one or more sensor films on a panel sheet, wherein at least one of the sensor films is configured with the above transparent conductor. Since the touch panel includes a sensor film configured with the above transparent conductor, shading due to the difference in transmittance between a conductive part and an insulating part can be sufficiently reduced.

The present invention provides, in still another aspect, a method for producing the above transparent conductor, the method comprising: a step of etching a laminate including the transparent resin substrate, the transmittance-controlling layer, the metal layer containing silver or a silver alloy, and the metal oxide layer in the order presented to remove a part of the metal layer and the metal oxide layer, without removing the transmittance-controlling layer, for formation of the first laminate part and the second laminate part. Thereby, a transparent conductor capable of sufficiently preventing generation of shading due to the shape of a conductive part and insulating part can be produced at high production efficiency.

Advantageous Effects of Invention

The present invention can provide a transparent conductor capable of sufficiently preventing generation of shading due to the difference in transmittance between a conductive part and an insulating part. The present invention can further provide a production method capable of producing such a transparent conductor at high productivity. Furthermore, the present invention can provide a touch panel with shading due to the difference in transmittance between a conductive part and an insulating part sufficiently reduced by using such a transparent conductor.

DESCRIPTION OF EMBODIMENTS

Figure 1:
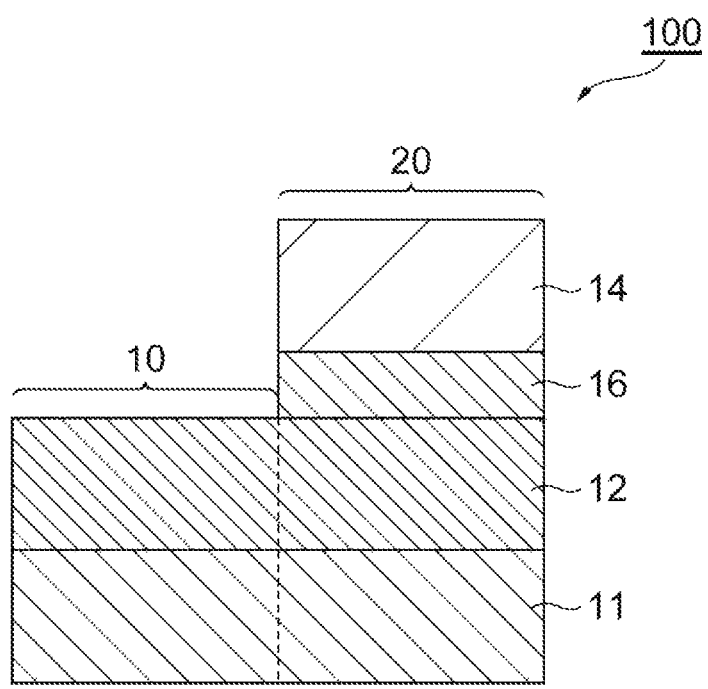
FIG. 1 is a cross-sectional view schematically illustrating one embodiment of the transparent conductor.

Embodiments of the present invention will be described in detail below with reference to drawings. However, the embodiments below are examples to describe the present invention, and are not intended to limit the present invention to the contents below. In descriptions, an identical reference sign is used for identical elements or elements having identical function, and redundant descriptions are occasionally omitted. The positional relation such as right and left and up and down in a drawing is as illustrated in the drawing, unless otherwise specified. In addition, the dimensional ratio in a drawing is not limited to that illustrated in the drawing.

FIG. 1 is a schematic cross-sectional view illustrating one embodiment of the transparent conductor. A transparent conductor 100 includes a first laminate part 10 in which a film-shaped transparent resin substrate 11 and a transmittance-controlling layer 12 are laminated, and a second laminate part 20 in which the transparent resin substrate 11, the transmittance-controlling layer 12, a metal layer 16, and a metal oxide layer 14 are laminated in the order presented. The first laminate part 10 and the second laminate part 20 are provided in a manner such that they are adjacent to each other in a direction (the right and left direction in FIG. 1) perpendicular to the direction of lamination of them (the up and down direction in FIG. 1). The first laminate part 10 and the second laminate part 20 may be provided alternately along the perpendicular direction.

"Transparent" in the present specification means that visible lights transmit, and a certain degree of light scattering is permitted. The degree of light scattering required for the transparent conductor 100 depends on the application thereof. What is called "semitransparent", which allows light scattering, is also included in the concept of "transparent" in the present specification. It is preferable that the degree of light scattering be smaller and the transparency be higher.

The first laminate part 10 is to function as an insulating part without a conductor, the insulating part formed, for example, through a patterning process. The transmittance of the first laminate part 10 without a glass layer above the transmittance-controlling layer 12 in the direction of lamination, T1, may be, for example, 80% or higher, or may be 82% or higher. Such high T1 can impart excellent display performance to the transparent conductor. The transmittance of the first laminate part 10 without a glass layer above the transmittance-controlling layer 12, T1, may be, for example, 90% or lower, or may be 85% or lower. The "transmittance" in the present specification refers to transmittance at a wavelength of 550 nm measured by using a commercially available hazemeter. This transmittance is transmittance for light including diffused transmitted light and determined by using an integrating sphere.

The second laminate part 20 is to function as a conductive part formed, for example, through a patterning process. The transmittance of the second laminate part 20 without a glass layer above the metal oxide layer 14 in the direction of lamination, T2, may be, for example, 80% or higher, or may be 85% or higher. Such high T2 can impart excellent display performance to the transparent conductor. The transmittance of the second laminate part 20 without a glass layer above the metal oxide layer 14, T2, may be 93% or lower, or may be 91% or lower.

The difference between T1 and T2 (T2−T1) is 4% or more, and may be 5% or more. Thereby, the absolute value of the difference between the transmittance of a third laminate part obtained by providing a glass layer above the transmittance-controlling layer 12 in the first laminate part 10, T3, and the transmittance of a fourth laminate part obtained by providing a glass layer above the metal oxide layer 14 in the second laminate part, T4, |T4−T3|, can be set sufficiently small. |T4−T3| may be 1% or less, or may be 0.8% or less. The difference between T and T2 (T2−T1) may be 10% or less, or may be 8% or less, from the viewpoint of decreasing the absolute value.

The transparent resin substrate 11 may be any flexible organic resin film, without any limitation. The organic resin film may be an organic resin sheet. Examples of the organic resin film include polyester films such as polyethylene terephthalate (PET) films and polyethylene naphthalate (PEN) films; polyolefin films such as polyethylene films and polypropylene films; polycarbonate films; acrylic films; norbornene films; polyarylate films; polyether sulfone films; diacetylcellulose films; and triacetylcellulose films. Among them, polyester films such as polyethylene terephthalate (PET) films and polyethylene naphthalate (PEN) films are preferable.

It is preferable that the transparent resin substrate 11 be thicker, from the viewpoint of rigidity. On the other hand, it is preferable that the transparent resin substrate 11 be thinner, from the viewpoint of thinning of the transparent conductor 100. From such viewpoints, the thickness of the transparent resin substrate 11 is, for example, 10 to 200 μm. The refractive index of the transparent resin substrate is, for example, 1.50 to 1.70, from the viewpoint of achieving a transparent conductor excellent in optical properties. The refractive index in the present specification is a value measured under conditions of $\lambda$=633 nm and a temperature of 20° C. by using a commercially available ellipsometer.

The transparent resin substrate 11 may have been subjected to at least one surface treatment selected from the group consisting of corona discharge treatment, glow discharge treatment, flame treatment, ultraviolet irradiation treatment, electron beam irradiation treatment, and ozone treatment. The transparent resin substrate may be a resin film. The configuration in which a resin film is used can impart excellent flexibility to the transparent conductor 100. Thereby, the transparent conductor 100 can be used not only as a transparent conductor for touch panels, but also for transparent electrodes of flexible organic EL lights or the like or electromagnetic shielding.

When the transparent conductor 100 is used as a sensor film constituting a touch panel, for example, a flexible organic resin film may be used for the transparent resin substrate 11 so as to allow appropriate deformation in response to an external input by the finger, a pen, or the like.

The material of the transmittance-controlling layer 12 is not limited. The transmittance-controlling layer 12 may be, for example, an oxide layer, a nitride layer, or a resin layer obtained by application of a resin composition followed by curing. The transmittance-controlling layer 12 is required to be insoluble in an etching solution to be used in removal of the metal layer 16 and the metal oxide layer 14, from the viewpoint of an easy patterning process. Thereby, the transmittance-controlling layer 12 is not removed in etching, and thus the transparent conductor 100 including the first laminate part 10 and the second laminate part 20 can be produced easily. In addition, the transmittance-controlling layer 12 is required to have insulation properties.

Examples of an oxide constituting the transmittance-controlling layer 12 include oxides containing zinc oxide and tin oxide as primary components. The configuration in which such an oxide is contained allows the transmittance-controlling layer 12 to have conductivity and high transparency in combination. The zinc oxide is, for example, ZnO, and the tin oxide is, for example, $SnO_2$. The ratio of metal atoms to oxygen atoms in each metal oxide may be deviated from the stoichiometric ratio.

Alternatively, the oxide constituting the transmittance-controlling layer 12 may be an oxide containing zinc oxide, as a primary component, at least one selected from tin oxide, niobium oxide, and chromium oxide at a content of 10 mol % or more, as an accessory component, and at least one selected from aluminum oxide, gallium oxide, titanium oxide, and germanium oxide, as another component. The oxide containing the accessory component is insoluble in acids. Accordingly, the transmittance-controlling layer 12 composed of the oxide can remain unetched without any change in an etching process, while the metal layer 16 containing silver or a silver alloy and the metal oxide layer 14 are removed by etching. In addition, an oxide composed of titanium oxide and niobium oxide can similarly remain unetched without any change.

The refractive index of the transmittance-controlling layer 12 may be, for example, 1.8 to 2.5, or may be 1.95 to 2.05. Such a refractive index allows the conductive part and the insulating part to have sufficiently high transmittance with the difference further decreased. Thereby, the image quality can be further enhanced while shading is further reduced.

The thickness of the transmittance-controlling layer 12 may be, for example, 10 to 100 nm, or may be 20 to 80 nm. Such a thickness allows the first laminate part 10 to have low transmittance T1. Thus, the transmittance of the third laminate part, T3, can be set to 90% or lower. The transmittances of the first laminate part 10 (third laminate part) and the second laminate part 20 (fourth laminate part) can be adjusted by changing the product of the thickness and the refractive index (thickness×refractive index) of the transmittance-controlling layer 12.

In the case that the transmittance-controlling layer 12 is an oxide layer or a nitride layer, the transmittance-controlling layer 12 can be produced by using a vacuum film formation method such as a vacuum deposition method, a sputtering method, an ion plating method, and a CVD method. Among them, a sputtering method is preferable because a smaller film-forming chamber can be used and the film-forming speed is high in a sputtering method. Examples of the sputtering method include DC magnetron sputtering. For the target, an oxide target or a metal or metalloid target can be used.

The metal layer 16 is a layer containing silver or a silver alloy as a primary component. The configuration in which the metal layer 16 has high conductivity allows the transparent conductor 100 to have sufficiently low surface resistance. The additive elements constituting the silver alloy together with Ag are, for example, at least one selected from Pd, Cu, Nd, In, Sn, and Sb. Examples of the silver alloy include Ag—Pd, Ag—Cu, Ag—Pd—Cu, Ag—Nd—Cu, Ag—In—Sn, and Ag—Sn—Sb.

It is preferable that the content of the additive elements in the metal layer 16 be 0.5% by mass or more and 5% by mass or less. If the content is less than 0.5% by mass, the corrosion resistance-enhancing effect of Ag tends to be lower. If the content is more than 5% by mass, on the other hand, the transmittance tends to be lower with higher absorbance. The thickness of the metal layer 16 is, for example, 3 to 20 nm. From the viewpoint of sufficient enhancement of the transmittance of the transparent conductor 100 with the surface resistance kept sufficiently low, the thickness of the metal layer 16 is preferably 4 to 15 nm. If the thickness of the metal layer 16 is excessively large, the transmittance tends to be lower. If the thickness of the metal layer 16 is excessively small, on the other hand, the surface resistance tends to be higher.

The metal layer 16 has a function to adjust the transmittance and surface resistance of the transparent conductor 100. The metal layer 16 can be produced by using a vacuum film formation method such as a vacuum deposition method, a sputtering method, an ion plating method, and a CVD method. Among them, a sputtering method is preferable because a smaller film-forming chamber can be used and the film-forming speed is high in a sputtering method. Examples of the sputtering method include DC magnetron sputtering. For the target, a metal target can be used.

The metal oxide layer 14 is a transparent layer containing an oxide, and the composition is not limited. Examples of the oxide include oxides containing four components of zinc oxide, indium oxide, titanium oxide, and tin oxide, as primary components. The configuration in which the metal oxide layer 14 containing the four components as primary components and the metal layer 16 are laminated allows the metal oxide layer 14 and the metal layer 16 to have high conductivity and high transparency in combination without need of thermal annealing. In addition, the metal oxide layer 14 and the metal layer 16 laminated allows efficient patterning because they have excellent resistance to alkalis while they are easily removable with an acidic etching solution.

The zinc oxide is, for example, ZnO, the indium oxide is, for example, $In_2O_3$, the titanium oxide is, for example, $TiO_2$, and the tin oxide is, for example, $SnO_2$. The ratio of metal atoms to oxygen atoms in each metal oxide may be deviated from the stoichiometric ratio.

In the metal oxide layer 14, the content of zinc oxide with respect to the total of the four components is, for example, 20 mol % or more, from the viewpoint of achieving a sufficiently high transmittance and conductivity. In the metal oxide layer 14, the content of zinc oxide with respect to the total of the four components is, for example, 68 mol % or less, from the viewpoint of achieving sufficiently high storage stability.

In the metal oxide layer 14, the content of indium oxide with respect to the total of the four components is, for example, 35 mol % or less, from the viewpoint of achieving a sufficiently high transmittance with the surface resistance kept sufficiently low. In the metal oxide layer 14, the content of indium oxide with respect to the total of the four components is, for example, 15 mol % or more, from the viewpoint of achieving sufficiently high storage stability.

In the metal oxide layer 14, the content of titanium oxide with respect to the total of the four components is, for example, 15 mol % or less, from the viewpoint of achieving a sufficiently high transmittance. In the metal oxide layer 14, the content of titanium oxide with respect to the total of the four components is, for example, 5 mol % or more, from the viewpoint of achieving sufficiently high resistance to alkalis.

In the metal oxide layer 14, the content of tin oxide with respect to the total of the four components is, for example, 40 mol % or less, from the viewpoint of achieving a sufficiently high transmittance. In the metal oxide layer 14, the content of tin oxide with respect to the total of the four components is, for example, 5 mol % or more, from the viewpoint of achieving sufficiently high storage stability. The contents of the four components are values as zinc oxide, indium oxide, titanium oxide, and tin oxide are converted to ZnO, $In_2O_3$, $TiO_2$, and $SnO_2$, respectively.

Other examples of the oxide contained as a primary component in the metal oxide layer 14 include oxides containing three components of zinc oxide, gallium oxide, and germanium oxide. It is preferable that zinc oxide be contained at the highest content among the three components. Such an oxide contains zinc oxide at the highest content, and thus is excellent in economic efficiency.

The content of zinc oxide with respect to the total of the three component is, for example, 70 mol % or more, and preferably 75 mol % or more, from the viewpoint of achieving a sufficiently high transmittance and conductivity. The content of zinc oxide with respect to the total of the three components is, for example, 90 mol % or less, and preferably 84 mol % or less, from the viewpoint of achieving sufficiently high storage stability. If the content of zinc oxide is excessively high, white turbidity is likely to be generated during storage under a high temperature and high humidity environment. If the content of zinc oxide is excessively low, on the other hand, the transmittance and conductivity tend to be lower.

The content of gallium oxide with respect to the total of the three components is, for example, 15 mol % or less, and preferably 11 mol % or less, from the viewpoint of achieving a sufficiently high transmittance with the surface resistance kept sufficiently low. The content of gallium oxide with respect to the total of the three components is, for example, 5 mol % or more, and preferably 8 mol % or more, from the viewpoint of achieving sufficiently high storage stability. If the content of gallium oxide is excessively high, the surface resistance tends to be higher and the transmittance tends to be lower. If the content of gallium oxide is excessively low, on the other hand, white turbidity is likely to be generated and the surface resistance tends to increase during storage under a high temperature and high humidity environment.

The content of germanium oxide with respect to the total of the three components is, for example, 20 mol % or less, and preferably 14 mol % or less, from the viewpoint of achieving a sufficiently high transmittance with the surface resistance kept sufficiently low. The content of germanium oxide with respect to the total of the three components is, for example, 5 mol % or more, and preferably 8 mol % or more, from the viewpoint of achieving sufficiently high storage stability. If the content of germanium oxide is excessively high, the surface resistance tends to be higher and the transmittance tends to be lower. If the content of germanium oxide is excessively low, on the other hand, the surface resistance tends to increase during storage under a high temperature and high humidity environment. The contents of the three components are values as zinc oxide, gallium oxide, and germanium oxide are converted to ZnO, $Ga_2O_3$, and $GeO_2$, respectively.

The metal oxide layer 14 has a function to adjust optical properties, a function to protect the metal layer 16, and a function to ensure the conductivity, in combination. The metal oxide layer 14 may contain, in addition to the four components or the three components, any trace component or inevitable component in a quantity such that the functions of the metal oxide layer 14 are not largely impaired. However, it is preferable that the fraction of the total of the four components or the fraction of the total of the three components in the metal oxide layer 14 be high, from the viewpoint of imparting sufficiently high properties to the transparent conductor 100. In this case, the fraction is, for example, 95 mol % or more, and preferably 97 mol % or more. The metal oxide layer 14 may consist of the four components or the three components, without any limitation to the four components or the three components.

The transmittance-controlling layer 12 and the metal oxide layer 14 have different compositions. The configuration in which the transmittance-controlling layer 12 and the metal oxide layer 14 have different compositions allows the transmittance-controlling layer 12 to remain without any change while only a part (unmasked portion) of the metal oxide layer 14 and the metal layer 16 is removed in etching a laminate including the transparent resin substrate 11, the transmittance-controlling layer 12, the metal layer 16, and the metal oxide layer 14 in the order presented.

The refractive index of the metal oxide layer 14 may be, for example, 1.8 to 2.3, or may be 1.9 to 2.3. Such a refractive index allows the conductive part (fourth laminate part) and the insulating part (third laminate part) to have sufficiently high transmittance with the difference between them further decreased. Thereby, the image quality can be further enhanced while shading is further reduced.

The thickness of the metal oxide layer 14 may be, for example, 10 to 100 nm, or may be 20 to 80 nm. By optimizing the film thickness of the metal oxide layer 14 to such a thickness, the transmittance can be adjusted. Thus, the transmittance of the second laminate part 20, T2, can be set to 80% or higher. The transmittances of the first laminate part 10 (third laminate part) and the second laminate part 20 (fourth laminate part) can be adjusted by changing the product of the thickness and the refractive index (thickness× refractive index) of the metal oxide layer 14.

The metal oxide layer 14 can be produced by using a vacuum film formation method such as a vacuum deposition method, a sputtering method, an ion plating method, and a CVD method. Among them, a sputtering method is preferable because a smaller film-forming chamber can be used and the film-forming speed is high in a sputtering method. Examples of the sputtering method include DC magnetron sputtering. For the target, an oxide target or a metal or metalloid target can be used.

A wiring electrode or the like may be provided on the metal oxide layer 14. A current to conduct through the metal layer 16 is introduced from a wiring electrode or the like to be provided on the metal oxide layer 14 via the metal oxide layer 14. Accordingly, it is preferable that the metal oxide layer 14 have high conductivity.

Figure 2:
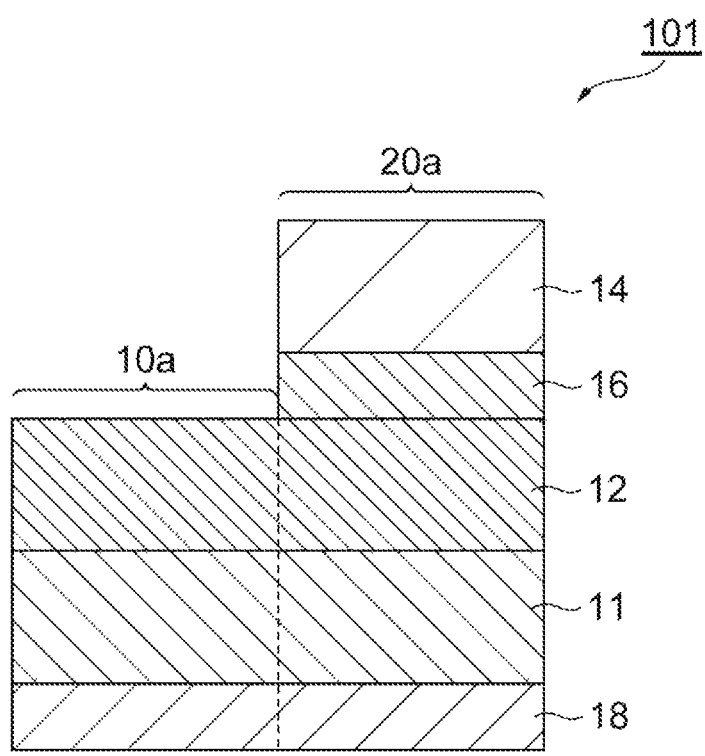
FIG. 2 is a cross-sectional view schematically illustrating another embodiment of the transparent conductor.

FIG. 2 is a schematic cross-sectional view illustrating another embodiment of the transparent conductor. A transparent conductor 101 differs from the transparent conductor 100 in that the transparent conductor 101 includes a hardcoat layer 18 on the back surface of the transparent resin substrate 11. That is, the transparent conductor 101 includes a hardcoat layer 18 in the side opposite to the transmittance-controlling layer 12 side. The constituents other than the hardcoat layer 18 are the same as those of the transparent conductor 100.

The transparent conductor 101 includes a first laminate part 10a in which the hardcoat layer 18, the transparent resin substrate 11, and the transmittance-controlling layer 12 are laminated in the order presented, and a second laminate part 20a in which the hardcoat layer 18, the transparent resin substrate 11, the transmittance-controlling layer 12, the metal layer 16, and the metal oxide layer 14 are laminated in the order presented. The first laminate part 10a and the second laminate part 20a are provided in a manner such that they are adjacent to each other in a direction (the right and left direction in FIG. 2) perpendicular to the direction of lamination of them (the up and down direction in FIG. 2).

The hardcoat layer 18 typically has almost no impact on the transmittances of the first laminate part 10a and the second laminate part 20a. The range of each of the transmittance of the first laminate part 10a, T1, and the transmittance of the second laminate part 20a, T2, and the relation between the two transmittances are the same as those for the first laminate part 10 and the second laminate part 20 in FIG. 1. Accordingly, the absolute value of the difference between the transmittance of a third laminate part obtained by providing a glass layer above the transmittance-controlling layer 12 in the first laminate part 10a, T3, and the transmittance of a fourth laminate part obtained by providing a glass layer above the metal oxide layer 14 in the second laminate part 20a, T4, |T4−T3|, can be set sufficiently small.

The configuration in which the hardcoat layers 18 are provided can sufficiently prevent generation of a scratch in the transparent resin substrate 11. Each of the hardcoat layers 18 contains a cured resin obtained by curing a resin composition. It is preferable that the resin composition contain at least one selected from the group consisting of thermosetting resin compositions, ultraviolet-curable resin compositions, and electron beam-curable resin compositions. The thermosetting resin composition may contain at least one selected from the group consisting of epoxy resins, phenoxy resins, and melamine resins.

The resin composition is, for example, a composition containing a curable compound having an energy ray-reactive group such as a (meth)acryloyl group and a vinyl group. The representation "(meth)acryloyl group" means that at least one of an acryloyl group and a methacryloyl group is included. It is preferable that the curable compound contain a polyfunctional monomer or oligomer including two or more, preferably three or more, energy ray-reactive groups in one molecule.

The curable compound preferably contains an acrylic monomer. Specific examples of the acrylic monomer include 1,6-hexanediol di(meth)acrylate, triethylene glycol di(meth) acrylate, ethylene oxide-modified bisphenol A di(meth)acrylate, trimethylolpropane tri(meth)acrylate, trimethylolpropane ethylene oxide-modified tri(meth)acrylate, trimethylolpropane propylene oxide-modified tri(meth)acrylate, pentaerythritol tetra(meth)acrylate, ditrimethylol propane tetra(meth)acrylate, dipentaerythritol penta(meth)acrylate, dipentaerythritol hexa(meth)acrylate, pentaerythritol tri(meth)acrylate, and 3-(meth)acryloyloxy glycerin mono (meth)acrylate. However, the acrylic monomer is not necessarily limited to them. Other examples of the acrylic monomer include urethane-modified acrylates and epoxy-modified acrylates.

For the curable compound, a compound having a vinyl group may be used. Examples of the compound having a vinyl group include ethylene glycol divinyl ether, pentaerythritol divinyl ether, 1,6-hexanediol divinyl ether, trimethylolpropane divinyl ether, ethylene oxide-modified hydroquinone divinyl ether, ethylene oxide-modified bisphenol A divinyl ether, pentaerythritol trivinyl ether, dipentaerythritol hexavinyl ether, and ditrimethylol propane polyvinyl ether. However, the compound having a vinyl group is not necessarily limited to them.

In the case that the curable compound is cured with an ultraviolet ray, the resin composition contains a photopolymerization initiator. Various photopolymerization initiators can be used. For example, the photopolymerization initiator can be appropriately selected from known compounds including acetophenone-based, benzoin-based, benzophenone-based, and thioxanthone-based compounds. More specific examples of the photopolymerization initiator include DAROCUR 1173, IRGACURE 651, IRGACURE 184, IRGACURE 907 (trade names, manufactured by BASF Japan Ltd.), and KAYACURE DETX-S (trade name, manufactured by Nippon Kayaku Co., Ltd.).

The content of the photopolymerization initiator can be about 0.01 to 20% by mass or 0.5 to 5% by mass with respect to the mass of the curable compound. The resin composition may be a known resin composition obtained by adding a photopolymerization initiator to an acrylic monomer. Examples of the resin composition obtained by adding a photopolymerization initiator to an acrylic monomer include SD-318 (trade name, manufactured by DIC Corporation) and XNR 5535 (trade name, manufactured by NAGASE & CO., LTD.), each as an ultraviolet-curable resin.

The resin composition may contain an organic fine particle and/or inorganic fine particle, for example, to enhance the strength of the coating film and/or adjust the refractive index. Examples of the organic fine particle include organic silicon fine particles, crosslinked acrylic fine particles, and crosslinked polystyrene fine particles. Examples of the inorganic fine particle include silicon oxide fine particles, aluminum oxide fine particles, zirconium oxide fine particles, titanium oxide fine particles, and iron oxide fine particles. Among them, silicon oxide fine particles are preferable.

Also preferable is a fine particle the surface of which has been treated with a silane coupling agent and includes energy ray-reactive groups including a (meth)acryloyl group and/or vinyl group present as a film thereon. Use of such a reactive fine particle can enhance the strength of the film through interparticle reaction of the fine particle or reaction between the fine particle and a polyfunctional monomer or oligomer during energy ray irradiation. A silicon oxide fine particle treated with a silane coupling agent containing a (meth)acryloyl group is preferably used.

The average particle diameter of the fine particle is smaller than the thickness of each of the hardcoat layers 18, and may be 100 nm or smaller, or 20 nm or smaller, from the viewpoint of ensuring sufficient transparency. From the viewpoint of production of a colloidal solution, on the other hand, the average particle diameter of the fine particle may be 5 nm or larger, or 10 nm or larger. In the case that an organic fine particle and/or inorganic fine particle is used, the total quantity of the organic fine particle and inorganic fine particle may be, for example, 5 to 500 parts by mass, or 20 to 200 parts by mass, with respect to 100 parts by mass of the curable compound.

If an energy ray-curable resin composition is used, the resin composition can be cured through irradiation with an energy ray such as an ultraviolet ray. Thus, use of such a resin composition is preferable from the viewpoint of the manufacture process.

The hardcoat layer 18 can be produced by applying a solution or dispersion of a resin composition onto one surface (back surface) of the transparent resin substrate 11 followed by drying to cure the resin composition. The application can be performed by using a known method. Examples of the application method include an extrusion nozzle method, a blade method, a knife method, a bar-coating method, a kiss-coating method, a kiss reverse method, a gravure roll method, a dipping method, a reverse roll method, a direct roll method, a curtain method, and a squeezing method.

The thickness of each of the hardcoat layer 18 is, for example, 0.5 to 10 μm. If the thickness is larger than 10 μm, unevenness in thickness or a wrinkle is likely to be generated. If the thickness is lower than 0.5 μm, on the other hand, in the case that quite a large quantity of low-molecular-weight components including a plasticizer or an oligomer is contained in the transparent resin substrate 11, it may be difficult to sufficiently prevent the bleed-out of the components.

The refractive index of the hardcoat layer 18 is, for example, 1.40 to 1.60. The absolute value of the refractive index difference between the transparent resin substrate 11 and the hardcoat layer 18 is, for example, 0.15 or less. The configuration in which the absolute value of the refractive index difference between the hardcoat layer 18 and the transparent resin substrate 11 is small can reduce the intensity of interference unevenness generated by unevenness in thickness in the hardcoat layer 18.

Figure 3:
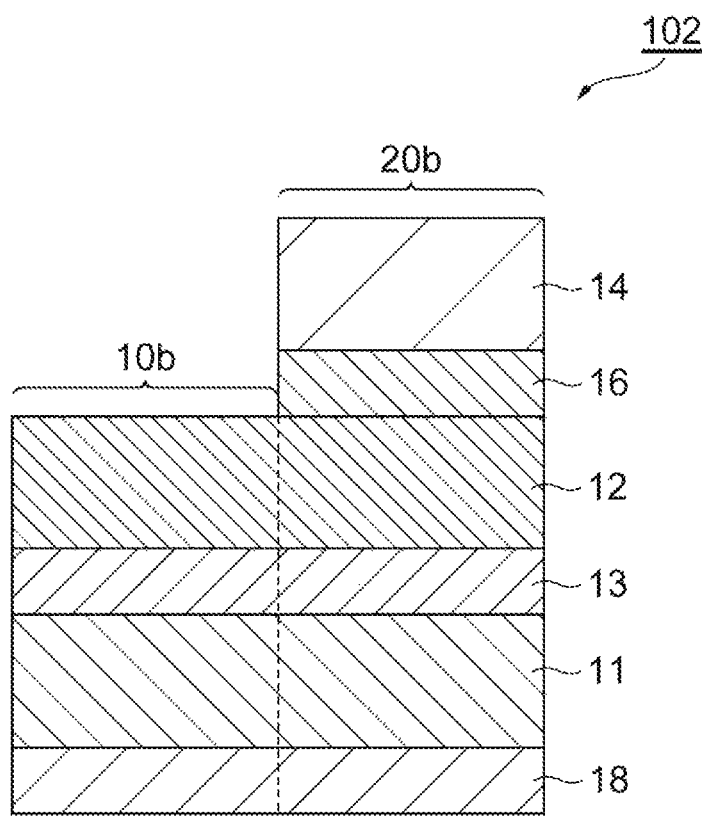
FIG. 3 is a cross-sectional view schematically illustrating still another embodiment of the transparent conductor.

FIG. 3 is a schematic cross-sectional view illustrating still another embodiment of the transparent conductor. A transparent conductor 102 differs from the transparent conductor 101 in that the transparent conductor 102 includes a high refractive index layer 13 between the transparent resin substrate 11 and the transmittance-controlling layer 12. The constituents other than the high refractive index layer 13 are the same as those of the transparent conductor 101. The constituents other than the high refractive index layer 13 and the hardcoat layer 18 are the same as those of the transparent conductor 100.

The transparent conductor 102 includes a first laminate part 10b in which the hardcoat layer 18, the transparent resin substrate 11, the high refractive index layer 13, and the transmittance-controlling layer 12 are laminated in the order presented, and a second laminate part 20b in which the hardcoat layer 18, the transparent resin substrate 11, the high refractive index layer 13, the transmittance-controlling layer 12, the metal layer 16, and the metal oxide layer 14 are laminated in the order presented. The first laminate part 10b and the second laminate part 20b are provided in a manner such that they are adjacent to each other in a direction (the right and left direction in FIG. 3) perpendicular to the direction of lamination of them (the up and down direction in FIG. 3).

The range of each of the transmittance of the first laminate part 10b, T1, and the transmittance of the second laminate part 20b, T2, and the relation between the two transmittances are the same as those for the first laminate part 10 and the second laminate part 20 in FIG. 1. Accordingly, the absolute value of the difference between the transmittance of a third laminate part obtained by providing a glass layer above the transmittance-controlling layer 12 in the first laminate part 10b, T3, and the transmittance of a fourth laminate part obtained by providing a glass layer above the metal oxide layer 14 in the second laminate part 20b, T4, |T4−T3|, can be set sufficiently small.

The high refractive index layer 13 may be composed of the same material as the hardcoat layer 18. The high refractive index layer 13 can be produced by using the same method as for the hardcoat layer 18. Accordingly, the contents of description of the hardcoat layer 18 are also applied to the high refractive index layer 13.

The high refractive index layer 13 contains, for example, a cured resin obtained by curing a resin composition with an energy ray, as the hardcoat layer 18. For the resin composition, those exemplified for the hardcoat layer 18 can be used. For example, the energy ray-curable resin composition described for the hardcoat layer 18 can be used. That is, the resin composition is an energy ray-curable resin composition containing a curable compound having an energy ray-reactive group selected from a (meth)acryloyl group, a vinyl group, and so on. The resin composition may contain a polymer having a high refractive index.

The resin composition may contain a fine particle of metal oxide. Examples of the fine particle of metal oxide include fine particles of titanium oxide ($TiO_2$, refractive index: 2.35), zirconium oxide ($ZrO_2$, refractive index: 2.05), cerium oxide ($CeO_2$, refractive index: 2.30), niobium oxide ($Nb_2O_3$, refractive index: 2.15), antimony oxide ($Sb_2O_3$, refractive index: 2.10), tantalum oxide ($Ta_2O$, refractive index: 2.10), and combinations of two or more thereof.

The high refractive index layer 13 containing a cured resin and the fine particle of metal oxide can be produced by applying a resin composition obtained by dispersing the fine particle in a curable compound onto the transparent resin substrate 11 followed by curing. The content of the fine particle may be, for example, 5 to 500 parts by mass, or may be 20 to 200 parts by mass, with respect to 100 parts by mass of the curable compound. As the content of the fine particle is lower, the refractive index of the high refractive index layer 13 tends to be lower.

The refractive index of the high refractive index layer 13 is lower than that of the transmittance-controlling layer 12, and may be, for example, 1.55 to 1.80, or may be 1.57 to 1.75. If the refractive index of the high refractive index layer 13 is excessively low, the wavelength range allowing a small transmittance difference tends to be narrow. If the refractive index of the transmittance-controlling layer 12 is excessively high, on the other hand, the total light transmittance of the second laminate part 20b (and a fourth laminate part 40b to be described later) tends to be lower.

The thickness of the high refractive index layer 13 may be 10 to 150 nm, or may be 15 to 100 nm. If the thickness of the high refractive index layer 13 is excessively small, it tends to be difficult to produce the high refractive index layer 13 by application. If the thickness of the high refractive index layer 13 is excessively large, on the other hand, the total light transmittance of the second laminate part 20b (and a fourth laminate part 40b to be described later) tends to be lower.

The high refractive index layer 13 can be formed by using, for example, a resin composition in which titanium oxide ($TiO_2$) is dispersed in an energy ray-curable acrylic resin component (trade name: TYT80, manufactured by TOYO INK CO., LTD., refractive index: 1.80), or a resin composition in which zirconium oxide ($ZrO_2$) is dispersed in an energy ray-curable acrylic resin component (trade name: TYZ70, manufactured by TOYO INK CO., LTD., refractive index: 1.70). The high refractive index layer 13 may be formed by using a resin composition containing a polymer having a high refractive index. Examples of the polymer having a high refractive index include UR-101 (trade name, refractive index: 1.70, manufactured by Nissan Chemical Industries, Ltd.).

The high refractive index layer 13 can be produced by applying the above-described resin composition onto the transparent resin substrate 11 such as a PET substrate followed by drying and subsequent curing through ultraviolet irradiation. The application can be performed by using a known method. Examples of the application method include an extrusion nozzle method, a blade method, a knife method, a bar-coating method, a kiss-coating method, a kiss reverse method, a gravure roll method, a dipping method, a reverse roll method, a direct roll method, a curtain method, and a squeezing method. These application methods are more preferable than a vacuum film formation method with a sputtering method or the like, from the viewpoint of production cost.

The refractive index of the high refractive index layer 13 can be adjusted, for example, by changing the type and content of the fine particle contained in the high refractive index layer. The configuration in which the high refractive index layer 13 is provided can widen the wavelength range allowing a small transmittance difference.

Figure 4:
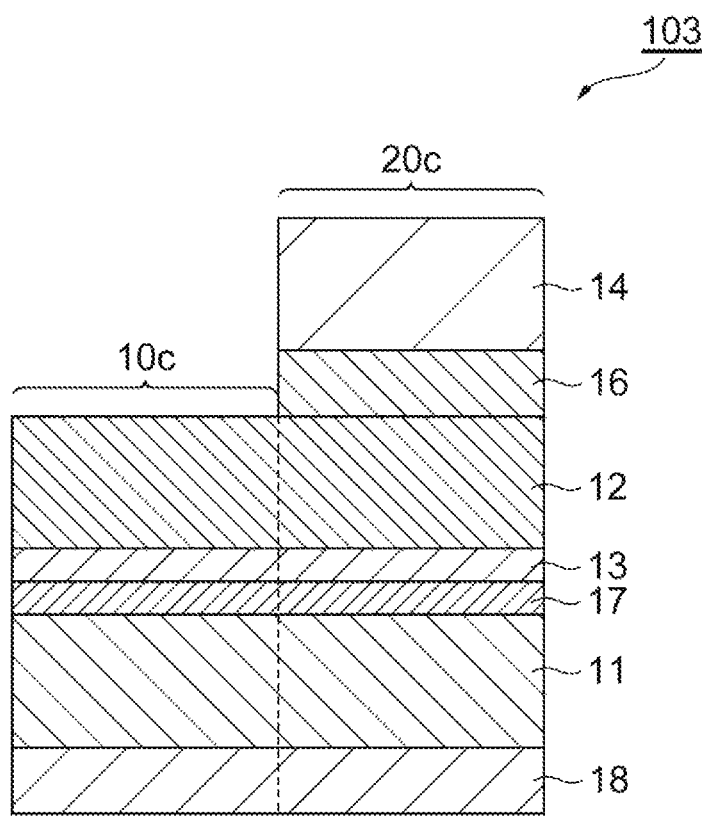
FIG. 4 is a cross-sectional view schematically illustrating still another embodiment of the transparent conductor.

FIG. 4 is a schematic cross-sectional view illustrating still another embodiment of the transparent conductor. A transparent conductor 103 differs from the transparent conductor 102 in that the transparent conductor 103 includes a low refractive index layer 17 between the transparent resin substrate 11 and the high refractive index layer 13. The constituents other than the low refractive index layer 17 are the same as those of the transparent conductor 102. The constituents other than the low refractive index layer 17, the high refractive index layer 13, and the hardcoat layer 18 are the same as those of the transparent conductor 100.

The transparent conductor 103 includes a first laminate part 10c in which the hardcoat layer 18, the transparent resin substrate 11, the low refractive index layer 17, the high refractive index layer 13, and the transmittance-controlling layer 12 are laminated in the order presented, and a second laminate part 20c in which the hardcoat layer 18, the transparent resin substrate 11, the low refractive index layer 17, the high refractive index layer 13, the transmittance-controlling layer 12, the metal layer 16, and the metal oxide layer 14 are laminated in the order presented. The first laminate part 10c and the second laminate part 20c are provided in a manner such that they are adjacent to each other in a direction (the right and left direction in FIG. 4) perpendicular to the direction of lamination of them (the up and down direction in FIG. 4).

The range of each of the transmittance of the first laminate part 10c, T1, and the transmittance of the second laminate part 20c, T2, and the relation between the two transmittances are the same as those for the first laminate part 10 and the second laminate part 20 in FIG. 1. Accordingly, the absolute value of the difference between the transmittance of a third laminate part obtained by providing a glass layer above the transmittance-controlling layer 12 in the first laminate part 10c, T3, and the transmittance of a fourth laminate part obtained by providing a glass layer above the metal oxide layer 14 in the second laminate part 20c, T4, |T4−T3|, can be set sufficiently small.

The low refractive index layer 17 may be composed of the same material as the hardcoat layer 18. The low refractive index layer 17 can be produced by using the same method as for the hardcoat layer 18. Accordingly, the contents of description of the hardcoat layer 18 are also applied to the low refractive index layer 17.

The low refractive index layer 17 contains, for example, a cured resin obtained by curing a resin composition with an energy ray, as the hardcoat layer 18. For the resin composition, the resin composition exemplified for the hardcoat layer 18 can be used. For the resin composition, for example, the energy ray-curable resin composition described for the hardcoat layer 18 can be used. That is, the resin composition may be an energy ray-curable resin composition containing a curable compound having an energy ray-reactive group selected from a (meth)acryloyl group, a vinyl group, and so on.

The resin composition may contain a fine particle of metal oxide. Examples of the fine particle of metal oxide include fine particles of silicon oxide ($SiO_2$, refractive index: 1.55).

The low refractive index layer 17 containing a cured resin and such a fine particle of metal oxide can be produced by applying a resin composition obtained by dispersing the fine particle in a curable compound onto the transparent resin substrate 11 followed by curing. The content of the fine particle may be, for example, 5 to 500 parts by mass, or may be 20 to 200 parts by mass, with respect to 100 parts by mass of the curable compound. As the content of the fine particle is lower, the refractive index of the low refractive index layer 17 tends to be lower.

The refractive index of the low refractive index layer 17 is lower than those of the transmittance-controlling layer 12 and the high refractive index layer 13, and may be, for example, 1.40 to 1.60, or may be 1.45 to 1.55. If the refractive index of the low refractive index layer 17 is excessively low, the wavelength range allowing a small transmittance difference tends to be narrow. If the refractive index of the low refractive index layer 17 is excessively high, on the other hand, the total light transmittance of the second laminate part 20c (and a fourth laminate part 40c to be described later) tends to be lower.

The thickness of the low refractive index layer 17 may be 10 to 150 nm, or may be 15 to 130 nm. If the thickness of the low refractive index layer 17 is excessively small, it tends to be difficult to produce the low refractive index layer 17 by application. If the thickness of the low refractive index layer 17 is excessively large, on the other hand, the total light transmittance of the second laminate part 20c (and a fourth laminate part 40c to be described later) tends to be lower.

The low refractive index layer 17 can be produced by applying the above-described resin composition onto the transparent resin substrate 11 such as a PET substrate followed by drying and subsequent curing through ultraviolet irradiation. The application can be performed by using a known method. Examples of the application method include an extrusion nozzle method, a blade method, a knife method, a bar-coating method, a kiss-coating method, a kiss reverse method, a gravure roll method, a dipping method, a reverse roll method, a direct roll method, a curtain method, and a squeezing method. These application methods are more preferable than a vacuum film formation method with a sputtering method or the like, from the viewpoint of production cost.

The refractive index of the low refractive index layer 17 can be adjusted, for example, by changing the type and content of the fine particle contained in the low refractive index layer 17. The configuration in which the low refractive index layer 17 is provided can decrease the transmittance difference in a broad wavelength range of visible lights.

The thickness of each of the transparent conductors 100, 101, 102, and 103 may be 200 μm or smaller, or may be 150 μm or smaller. Such a thickness can sufficiently meet the required level of thinning. Each of the transparent conductors 100, 101, 102, and 103 may be used, for example, directly as a part for touch panels or the like, or a plurality of them may be laminated via an optical clear adhesive. The layer configurations of transparent conductors to be laminated may be the same or different. For example, the transparent conductors 100 may be laminated, or the transparent conductor 101 and the transparent conductor 102 may be laminated. A glass layer may be laminated, via an optical clear adhesive, above one transparent conductor or a plurality of transparent conductors laminated. Even in such embodiments, shading due to the shape of a conductive part and insulating part can be sufficiently reduced.

A method for producing the transparent conductor 100 includes a step of etching a laminate including the transparent resin substrate 11, the transmittance-controlling layer 12, the metal layer 16, and the metal oxide layer 14 in the order presented to remove a part of the metal layer 16 and the metal oxide layer 14. In the step, the other part of the metal layer 16 and the metal oxide layer 14, and the transmittance-controlling layer 12 are allowed to remain without being removed. Thereby, the first laminate part 10 and the second laminate part 20 are formed. Another type of the transparent conductor can be produced by etching a laminate including at least one of the hardcoat layer 18, the high refractive index layer 13, and the low refractive index layer 17, which are included in the corresponding laminate structure. Each of the transparent conductors 101, 102, and 103 can be produced in the same manner for the transparent conductor 100.

Figure 5:
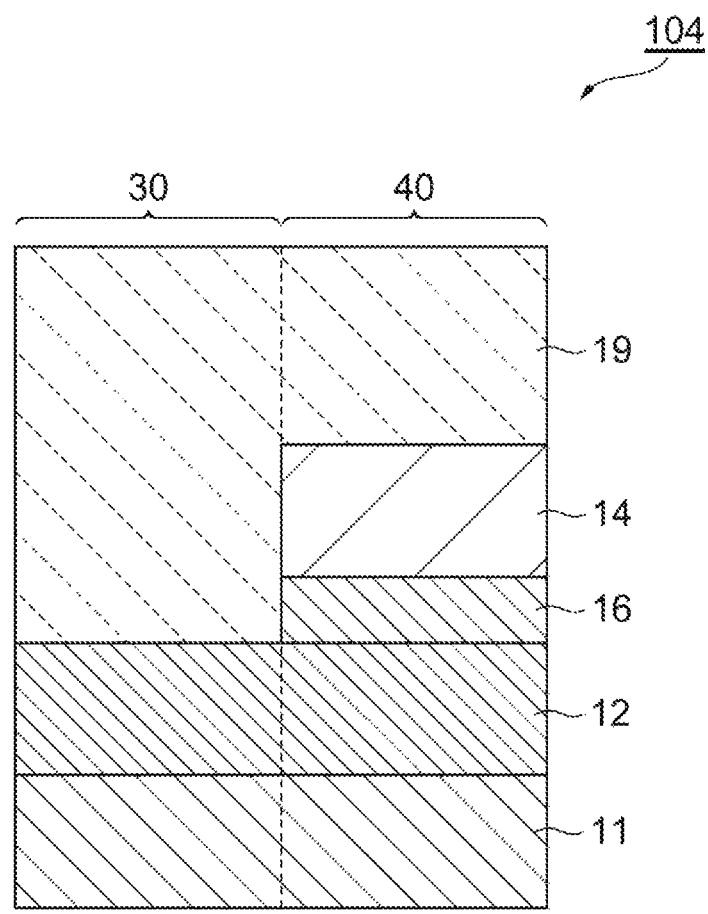
FIG. 5 is a cross-sectional view schematically illustrating still another embodiment of the transparent conductor.

FIG. 5 is a schematic cross-sectional view illustrating still another embodiment of the transparent conductor. A transparent conductor 104 in FIG. 5 differs from the transparent conductor 100 in that the transparent conductor 104 includes a glass layer 19 above the transmittance-controlling layer 12 and the metal oxide layer 14. The constituents other than the glass layer 19 are the same as those of the transparent conductor 100. Accordingly, the transparent conductor 100 can be used as an intermediate for producing the transparent conductor 104.

The transparent conductor 104 includes a third laminate part 30 in which the transparent resin substrate 11, the transmittance-controlling layer 12, and the glass layer 19 are laminated in the order presented, and a fourth laminate part 40 in which the transparent resin substrate 11, the transmittance-controlling layer 12, the metal layer 16, the metal oxide layer 14, and the glass layer 19 are laminated in the order presented. The third laminate part 30 and the fourth laminate part 40 are provided in a manner such that they are adjacent to each other in a direction (the right and left direction in FIG. 5) perpendicular to the direction of lamination of them (the up and down direction in FIG. 5). The third laminate part 30 and the fourth laminate part 40 may be provided alternately along the perpendicular direction.

The third laminate part 30 has a structure in which the glass layer 19 is laminated on the transmittance-controlling layer 12 in the first laminate part 10 of the transparent conductor 100. The glass layer 19 may be composed of one or more glass sheets. The glass layer 19 may be pasted on the transmittance-controlling layer 12 via an optical clear adhesive not illustrated. The fourth laminate part 40 has a structure in which the glass layer 19 is laminated on the metal oxide layer 14 in the second laminate part 20 of the transparent conductor 100. The glass layer 19 may be composed of one or more glass sheets. The glass layer 19 may be pasted on the metal oxide layer 14 via an optical clear adhesive not illustrated.

The thickness of the glass layer 19 is, for example, 0.1 to 5 mm. The thickness of the glass layer 19 can be adjusted according to the application. The refractive index of the glass layer 19 is, for example, 1.4 to 1.6.

The third laminate part 30 corresponds to an insulating part without any conductive part. The transmittance of the third laminate part 30 in the direction of lamination, T3, may be 84% or higher, or 85% or higher. Such high T3 can impart excellent display performance to the transparent conductor. The transmittance of the third laminate part 30, T3, is 90% or lower, and may be 89.5% or lower. Thereby, the absolute value of the difference between T3 and T4 can be set sufficiently small.

The fourth laminate part 40 corresponds to a conductive part. The transmittance of the fourth laminate part 40 in the direction of lamination, T4, is 85% or higher, and may be 87% or higher. Such high T4 can impart excellent display performance to the transparent conductor. The transmittance of the fourth laminate part 40, T4, may be 93% or lower, or may be 91% or lower.

The absolute value of the difference between T4 and T3, |T4−T3|, may be 0.1% or more and 1.0% or less. Thereby, generation of shading due to the difference in transmittance between a conductive part and an insulating part can be sufficiently prevented.

Figure 6:
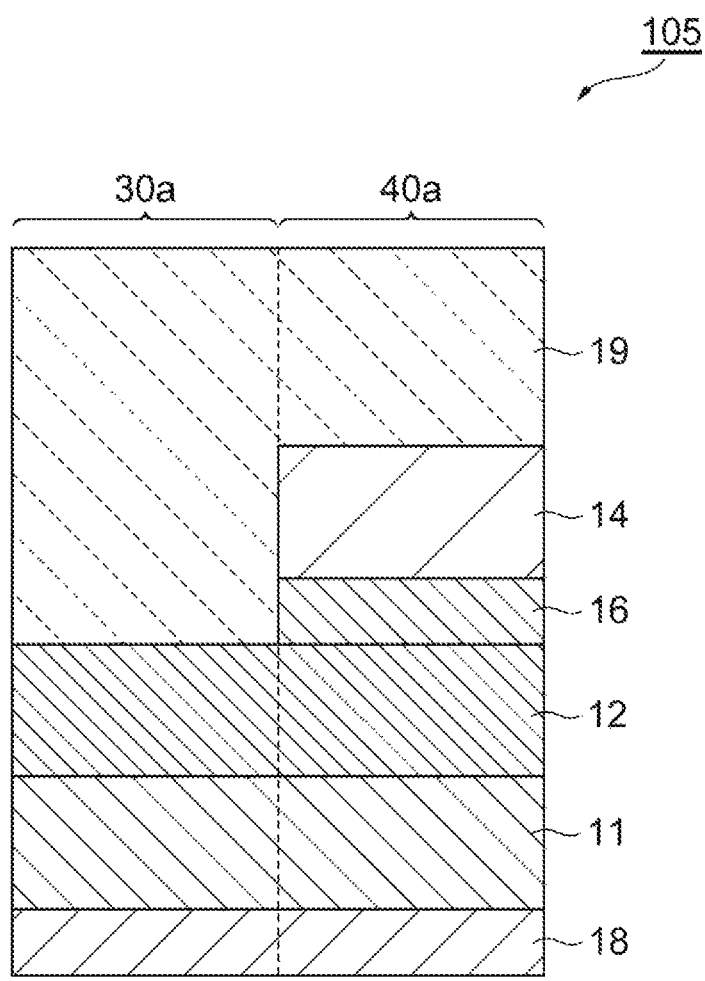
FIG. 6 is a cross-sectional view schematically illustrating still another embodiment of the transparent conductor.

FIG. 6 is a schematic cross-sectional view illustrating still another embodiment of the transparent conductor. A transparent conductor 105 in FIG. 6 differs from the transparent conductor 101 in FIG. 2 in that the transparent conductor 105 includes the glass layer 19 above the transmittance-controlling layer 12 and the metal oxide layer 14. The constituents other than the glass layer 19 are the same as those of the transparent conductor 101. Accordingly, the transparent conductor 101 can be used as an intermediate for producing the transparent conductor 105.

The transparent conductor 105 includes a third laminate part 30a in which the hardcoat layer 18, the transparent resin substrate 11, the transmittance-controlling layer 12, and the glass layer 19 are laminated in the order presented, and a fourth laminate part 40a in which the hardcoat layer 18, the transparent resin substrate 11, the transmittance-controlling layer 12, the metal layer 16, the metal oxide layer 14, and the glass layer 19 are laminated in the order presented. The third laminate part 30a and the fourth laminate part 40a are provided in a manner such that they are adjacent to each other in a direction (the right and left direction in FIG. 6) perpendicular to the direction of lamination of them (the up and down direction in FIG. 6).

The third laminate part 30a corresponding to an insulating part without any conductor has a structure in which the glass layer 19 is laminated on the transmittance-controlling layer 12 in the first laminate part 10a of the transparent conductor 101 illustrated in FIG. 2. The fourth laminate part 40a corresponding to a conductive part has a structure in which the glass layer 19 is laminated on the metal oxide layer 14 in the second laminate part 20a of the transparent conductor 101 illustrated in FIG. 2. The range of each of the transmittance of the third laminate part 30a, T3, and the transmittance of the fourth laminate part 40a, T4, and the relation between the two transmittances are the same as those for the transparent conductor 104.

Figure 7:
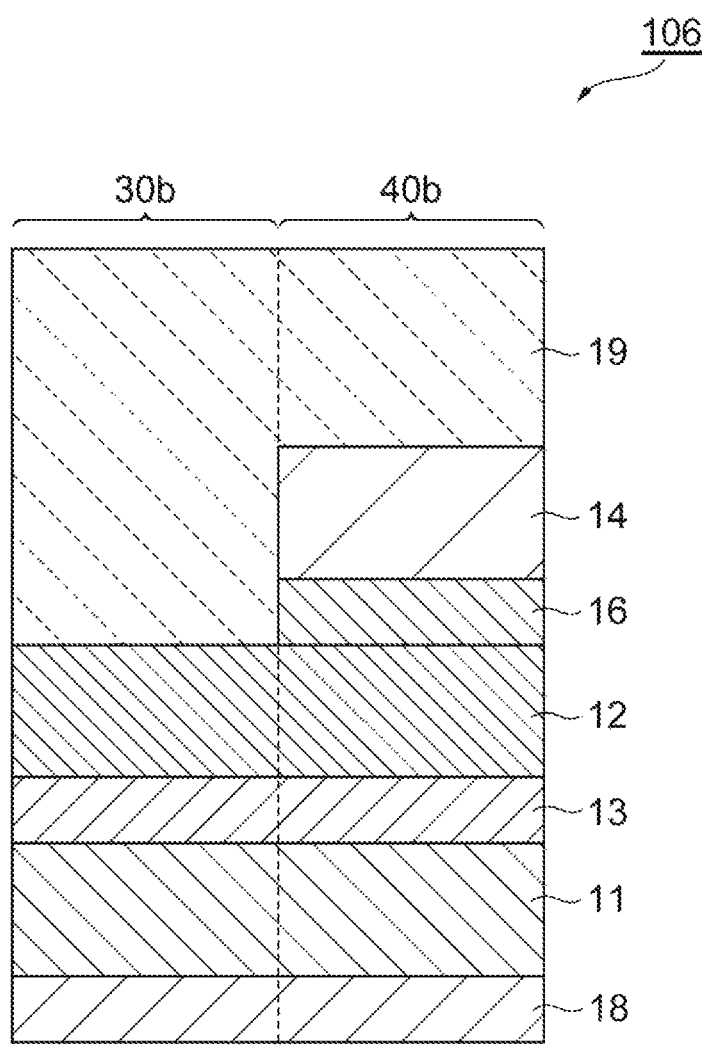
FIG. 7 is a cross-sectional view schematically illustrating still another embodiment of the transparent conductor.

FIG. 7 is a schematic cross-sectional view illustrating still another embodiment of the transparent conductor. A transparent conductor 106 in FIG. 7 differs from the transparent conductor 102 in FIG. 3 in that the transparent conductor 106 includes the glass layer 19 above the transmittance-controlling layer 12 and the metal oxide layer 14. The constituents other than the glass layer 19 are the same as those of the transparent conductor 102. Accordingly, the transparent conductor 102 can be used as an intermediate for producing the transparent conductor 106.

The transparent conductor 106 includes a third laminate part 30b in which the hardcoat layer 18, the transparent resin substrate 11, the high refractive index layer 13, the transmittance-controlling layer 12, and the glass layer 19 are laminated in the order presented, and a fourth laminate part 40b in which the hardcoat layer 18, the transparent resin substrate 11, the high refractive index layer 13, the transmittance-controlling layer 12, the metal layer 16, the metal oxide layer 14, and the glass layer 19 are laminated in the order presented.

The third laminate part 30b corresponding to an insulating part without any conductor has a structure in which the glass layer 19 is laminated on the transmittance-controlling layer 12 in the first laminate part 10b of the transparent conductor 102 illustrated in FIG. 3. The fourth laminate part 40b corresponding to a conductive part has a structure in which the glass layer 19 is laminated on the metal oxide layer 14 in the second laminate part 20b of the transparent conductor 102. The range of each of the transmittance of the third laminate part 30b, T3, and the transmittance of the fourth laminate part 40b, T4, and the relation between the two transmittances are the same as those for the transparent conductors 104 and 105.

Figure 8:
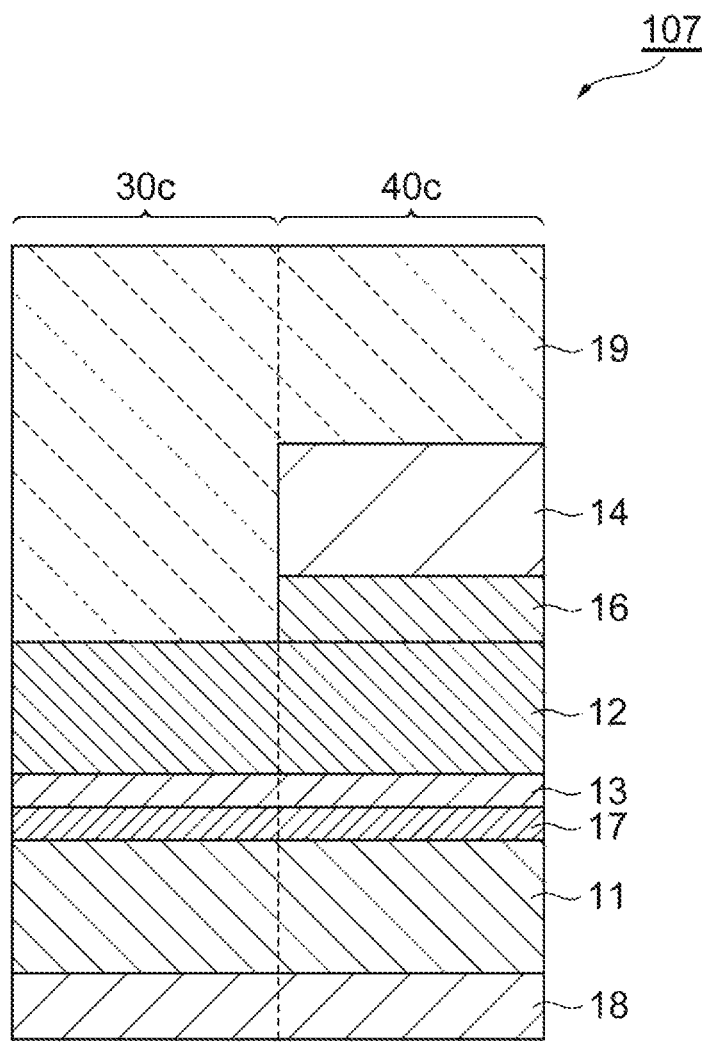
FIG. 8 is a cross-sectional view schematically illustrating still another embodiment of the transparent conductor.

FIG. 8 is a schematic cross-sectional view illustrating still another embodiment of the transparent conductor. A transparent conductor 107 in FIG. 8 differs from the transparent conductor 103 in FIG. 4 in that the transparent conductor 107 includes the glass layer 19 above the transmittance-controlling layer 12 and the metal oxide layer 14. The constituents other than the glass layer 19 are the same as those of the transparent conductor 103. Accordingly, the transparent conductor 103 can be used as an intermediate for producing the transparent conductor 107.

The transparent conductor 107 includes a third laminate part 30c in which the hardcoat layer 18, the transparent resin substrate 11, the low refractive index layer 17, the high refractive index layer 13, the transmittance-controlling layer 12, and the glass layer 19 are laminated in the order presented, and a fourth laminate part 40c in which the hardcoat layer 18, the transparent resin substrate 11, the low refractive index layer 17, the high refractive index layer 13, the transmittance-controlling layer 12, the metal layer 16, the metal oxide layer 14, and the glass layer 19 are laminated in the order presented.

The third laminate part 30c corresponding to an insulating part without any conductor has a structure in which the glass layer 19 is laminated on the transmittance-controlling layer 12 in the first laminate part 10c in the transparent conductor 103 illustrated in FIG. 4. The fourth laminate part 40c having a conductive part has a structure in which the glass layer 19 is laminated on the metal oxide layer 14 in the second laminate part 20c of the transparent conductor 103 illustrated in FIG. 4. The range of each of the transmittance of the third laminate part 30c, T3, and the transmittance of the fourth laminate part 40c, T4, and the relation between the two transmittances are the same as those for the transparent conductors 104, 105, and 106.

The transparent conductors 104, 105, 106, and 107 can sufficiently prevent generation of shading due to the difference in transmittance between a conductive part and an insulating part. Thus, the transparent conductors 104, 105, 106, and 107 can be used particularly suitably for applications including touch panels. The transparent conductor 104 can be produced by performing a step of providing the glass layer 19 so as to cover the transmittance-controlling layer 12 and the metal oxide layer 14 of the transparent conductor 100. Each of the transparent conductors 105, 106, and 107 can be produced in the same manner as for the transparent conductor 104. The glass layer 19 may be pasted on the transmittance-controlling layer 12 and the metal oxide layer 14 with an optical clear adhesive.

The thickness of each layer constituting each of the above-described transparent conductors can be measured by using the following procedure. The transparent conductor is cut with a focused ion beam (FIB) apparatus to obtain a cross-section. The cross-section is observed under a transmission electron microscope (TEM) to measure the thickness of each layer. It is preferable to measure at 10 or more positions arbitrarily selected to determine the average value.

To obtain a cross-section, a microtome may be used as an apparatus other than a focused ion beam apparatus. For measurement of thickness, a scanning electron microscope (SEM) may be used. Alternatively, measurement of film thickness can be performed by using an X-ray fluorescence spectrometer.

Figure 9:
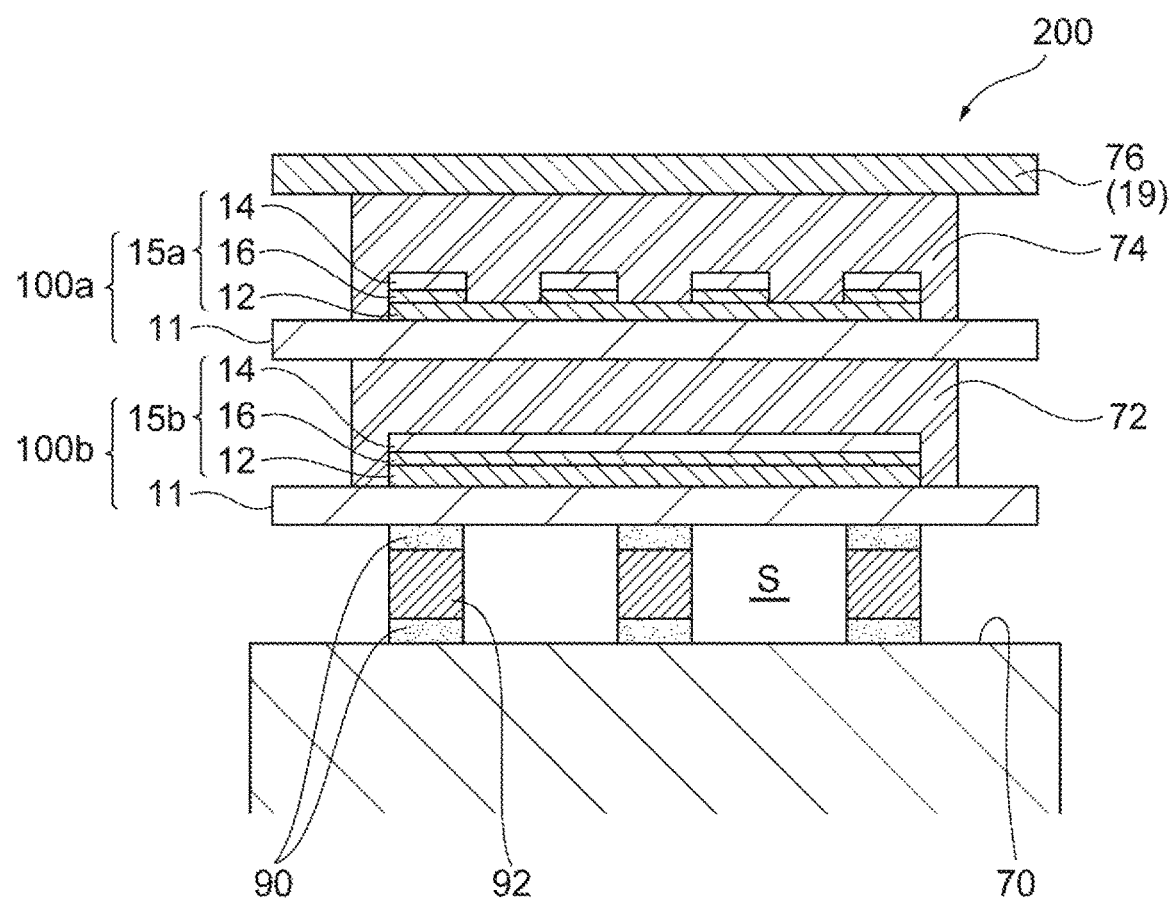
FIG. 9 is a schematic cross-sectional view illustrating an enlarged partial cross-section of the touch panel in one embodiment.
Figure 10:
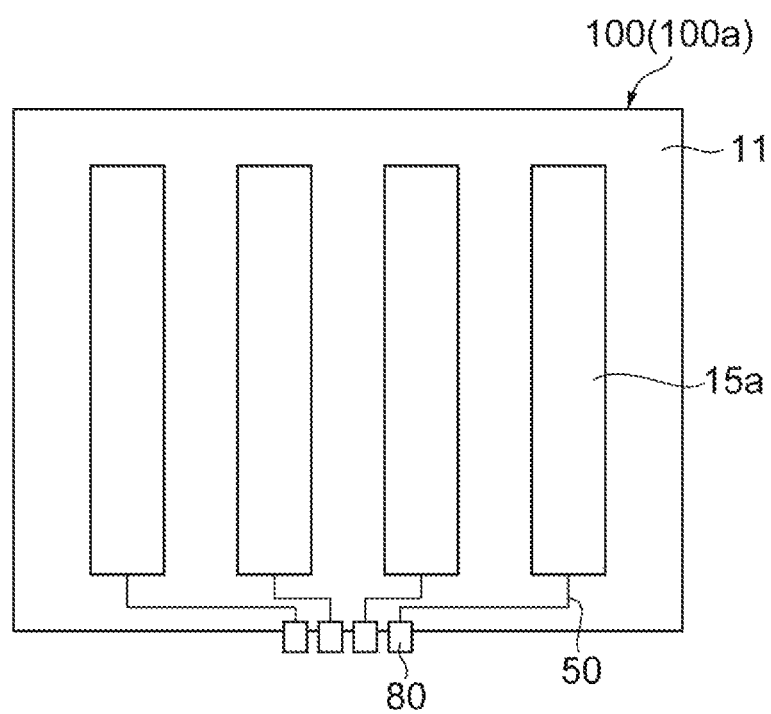
FIG. 10 is a plan view of a sensor film constituting one embodiment of the touch panel.
Figure 10:
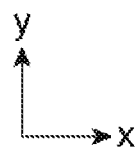
Figure 11:
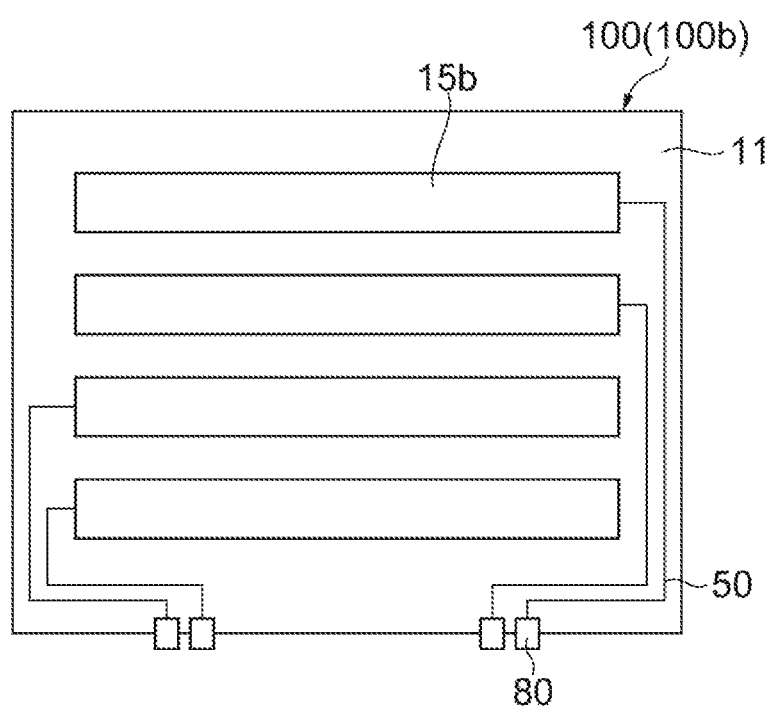
FIG. 11 is a plan view of a sensor film constituting one embodiment of the touch panel.
Figure 11:
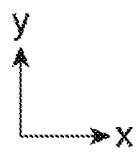

FIG. 9 is a schematic cross-sectional view illustrating an enlarged partial cross-section of a touch panel 200 including a pair of sensor films. FIGS. 10 and 11 are plan views of sensor films 100a and 100b, respectively, each with the above-described transparent conductor 100. The touch panel 200 includes a pair of sensor films 100a and 100b oppositely disposed via an optical clear adhesive 72. The touch panel 200 is configured to be capable of calculating a position touched by a contact body as a coordinate position (horizontal position and vertical position) in a two-dimensional coordinate (X-Y coordinate) plane parallel to a panel sheet 70 as a display.

As illustrated in FIG. 9, the touch panel 200 includes a sensor film 100a for detecting a vertical position (hereinafter, referred to as "sensor film for Y") and a sensor film 100b for detecting a horizontal position (hereinafter, referred to as "sensor film for X") pasted together via an optical clear adhesive 72. In the bottom surface side of the sensor film for X 100b, spacers 92 are provided between the sensor film for X 100b and the panel sheet 70 as a display device.

In the upper surface side of the sensor film for Y 100a (the side opposite to the panel sheet 70), a cover glass 76 is provided via an optical clear adhesive 74. That is, the touch panel 200 has a structure in which the sensor film for X 100b, the sensor film for Y 100a, and the cover glass 76 are disposed above the panel sheet 70 in the order presented from the panel sheet 70 side.

The sensor film for Y 100a for detecting a vertical position and the sensor film for X 100b for detecting a horizontal position are each composed of the above-described transparent conductor 100. The sensor film for Y 100a and the sensor film for X 100b include, as a conductive part, sensor electrodes 15a and sensor electrodes 15b, respectively, facing to the cover glass 76.

The sensor electrodes 15a and 15b each include a laminate including the transmittance-controlling layer 12, the metal layer 16, and the metal oxide layer 14 in the order presented. The metal layer 16 and the metal oxide layer 14 have been partially removed by etching or the like. As illustrated in FIG. 10, the sensor electrodes 15a extend in the vertical direction (y direction) so as to detect a touched position in the vertical direction (y direction). The sensor electrodes 15a are disposed in parallel to each other along the vertical direction (y direction). One end of each sensor electrode 15a is connected to an electrode 80 in the driving IC side via a conductor line 50 formed of a silver paste.

The sensor film for X 100b for detecting a horizontal position includes sensor electrodes 15b on the surface facing to the sensor film for Y 100a. The sensor electrodes 15b each include a laminate in which the transmittance-controlling layer 12, the metal layer 16, and the metal oxide layer 14 are laminated in the order presented. As illustrated in FIG. 11, the sensor electrodes 15b extend in the horizontal direction (x direction) so as to detect a touch position in the horizontal direction (x direction). The sensor electrodes 15b are disposed in parallel to each other along the horizontal direction (x direction). One end of each sensor electrode 15b is connected to an electrode 80 in the driving IC side via a conductor line 50 formed of a silver paste.

The sensor electrodes 15a and 15b may each include the hardcoat layer 18. The sensor electrodes 15a and 15b may each include the high refractive index layer 13 or the low refractive index layer 17 between the transparent resin substrate 11 and the transmittance-controlling layer 12.

As illustrated in FIG. 9, the sensor film for Y 100a and the sensor film for X 100b are laminated via the optical clear adhesive 72 in such a manner that the sensor electrodes 15a and 15b are perpendicular to each other as viewed from the direction of lamination of the sensor film for Y 100a and the sensor film for X 100b. In the side opposite to the sensor film for X 100b side of the sensor film for Y 100a, the cover glass 76 (glass layer 19) is provided via the optical clear adhesive 74. For the optical clear adhesives 74, the cover glass 76, and the panel sheet 70, common materials can be used.

Each of the conductor lines 50 and the electrodes 80 in FIGS. 10 and 11 includes a conductive material such as metal (e.g., Ag). The conductor lines 50 and the electrodes 80 are produced through pattern formation by screen printing. The transparent resin substrate 11 also has a function as a protective film to cover the surface of the touch panel 200.

The number and shape of the sensor electrodes 15a or 15b in each of the sensor films 100a and 100b are not limited to those in the embodiments illustrated in FIGS. 9, 10, and 11. For example, a larger number of the sensor electrodes 15a and 15b may be employed to enhance the precision of detecting a touched position. The sensor films 100a and 100b are each configured with the transparent conductor 100. The sensor films 100a and 100b may be each configured with any of the transparent conductors 101, 102, and 103, in place of the transparent conductor 100.

As illustrated in FIG. 9, the panel sheet 70 is provided, via the spacers 92, in the side opposite to the sensor film for Y 100a side of the sensor film for X 100b. The spacers 92 can be provided at positions corresponding to the shape of the sensor electrodes 15a and 15b and at positions surrounding the entire of the sensor electrodes 15a and 15b. Each spacer 92 may be formed of a material with translucency such as a PET (polyethylene terephthalate) resin. One end of each spacer 92 is adhered to the bottom surface of the sensor film for X 100b with an optical clear adhesive or an adhesive 90 with translucency such as an acrylic adhesive and an epoxy adhesive. The other end of each spacer 92 is adhered to the panel sheet 70 as a display device with the adhesive 90. Thus, an interspace S can be provided between the sensor film for X 100b and the panel sheet 70 as a display device by disposing the sensor film for X 100b and the panel sheet 70 so as to face each other via the spacers 92.

To each electrode 80 illustrated in FIGS. 10 and 11, a control unit (IC) may be electrically connected. The capacity change of each of the sensor electrodes 15a and 15b caused by a capacitance change between the fingertip and the sensor film for Y 100a of the touch panel 200 is measured. The control unit can calculate the position touched by the contact body as a coordinate position (an intersection between a position in the X-axis direction and a position in the Y-axis direction) on the basis of the measurement results. In addition to the above methods, various known methods can be employed for the method for driving the sensor electrodes and method for calculating a coordinate position.

The transmittance in the sensor film 100a in the direction of lamination differs between the conductive part with the sensor electrodes 15a and the insulating part without the sensor electrodes 15a by 4% or more. The transmittance in the sensor film 100b in the direction of lamination differs between the laminate part with the sensor electrodes 15b and the laminate part without the sensor electrodes 15b by 4% or more. In the state in which the sensor film 100a is laminated on the sensor film 100b via an optical clear adhesive, and a cover glass 76 as the glass layer is further provided above the sensor films 100b and 100a via an optical clear adhesive 74, on the other hand, the difference in transmittance between the laminate part including at least one of the sensor electrodes 15a and 15b (conductive part) and the laminate part including neither of the sensor electrodes 15a and 15b (insulating part) is sufficiently small. Accordingly, shading due to the difference in transmittance between a conductive part and an insulating part can be sufficiently reduced in the touch panel 200.

The touch panel 200 can be manufactured by using the following procedure. After the transparent conductor 100 is prepared, etching of the transmittance-controlling layer 12, the metal layer 16, and the metal oxide layer 14 is performed for patterning. Specifically, by using the technique of photolithography, a resist material is applied onto the surface of the metal oxide layer 14 through spin coating. Thereafter, pre-baking may be performed to improve the adhesion. Subsequently, a mask pattern is disposed, exposed, and developed with a developing solution to form a resist pattern. Formation of a resist pattern can be achieved not only through photolithography, but also through screen printing or the like. Any of the transparent conductors 101, 102, and 103 may be used in place of the transparent conductor 100.

Next, the transparent conductor 100 with the resist pattern formed thereon is soaked in an acidic etching solution to dissolve the second metal oxide layer 14 and the metal layer 16 for removal at the part without resist pattern formation. As necessary, the transmittance-controlling layer 12 may be dissolved for removal. The metal oxide layer 14 is excellent in solubility in acids for etching. Thus, formation of an electrode pattern can be smoothly performed through removal of the metal oxide layer 14 and the metal layer 16 in a single operation. Thereafter, the resist is removed with an alkaline solution, and thus the sensor film for Y 100a with the sensor electrodes 15a formed thereon and the sensor film for X 100b with the sensor electrodes 15b formed thereon can be obtained.

Through setting the composition of the transmittance-controlling layer 12 and that of the metal oxide layer 14 different from each other and setting the composition of the transmittance-controlling layer 12 so as not to allow removal of the transmittance-controlling layer 12 by etching, the transmittance-controlling layer 12 can remain without any change even after etching of the metal layer 16 and the metal oxide layer 14 in a single operation. For the etching solution, for example, an inorganic acid-based etching solution can be used without any limitation. Examples of inorganic acid-based etching solutions include phosphoric acid-based etching solutions and hydrochloric acid-based etching solutions.

Subsequently, a metal paste such as a silver alloy paste is applied to form the conductor lines 50 and electrodes 80. Thus, the control unit and the sensor electrodes 15a and 15b are electrically connected. Next, the sensor film for Y 100a and the sensor film for X 100b are pasted together with the optical clear adhesive 72 in an manner such that the sensor electrodes 15a and 15b of the sensor film for Y 100a and the sensor film for X 100b protrude in the same direction. In this case, the sensor film for Y 100a and the sensor film for X 100b are pasted together in a manner such that the sensor electrodes 15a and 15b are perpendicular to each other as viewed from the direction of lamination of the sensor film for Y 100a and the sensor film for X 100b. Then, the cover glass 76 and the sensor film for Y 100a are pasted together with the optical clear adhesive 74. Thus, the touch panel 200 can be manufactured.

It is not necessary to use the transparent conductor 100 for both of the sensor film for Y 100a and the sensor film for X 100b, and another transparent conductor may be used for any one of the sensor film for Y 100a and the sensor film for X 100b. Even such a touch panel can provide a sufficiently clear display.

As described above, the transparent conductors according to the above-described embodiments can be suitably used for touch panels. However, the application is not limited to touch panels, and if the metal oxide layer 14 and the metal layer 16 are processed into a predetermined shape by etching to form a part including the metal oxide layer 14 and the metal layer 16 (conductive part) and a part not including the metal oxide layer 14 and the metal layer 16 (insulating part), for example, the product can be used for transparent electrodes, prevention of electrostatic charging, and electromagnetic shielding in various display devices including liquid crystal displays (LCDs), plasma display panels (PDPs), and electroluminescence panels (organic EL, inorganic EL), electrochromic elements, and electronic papers. In addition, the product can be used as an antenna.

While the suitable embodiments of the present invention have been described hereinbefore, the present invention is not limited to the above-described embodiments. For example, any layer other than the above-described layers may be provided at any position of the transparent conductor according to each embodiment in a manner such that the function is not largely impaired. For example, an absorbing layer having a configuration in which a fine particle of metal oxide with absorbance, the metal oxide being, for example, antimony oxide, bismuth oxide, chromium oxide, and/or cerium oxide, is dispersed in a resin component may be provided between the transparent resin substrate 11 and the transmittance-controlling layer. Further, a known pressure-sensitive adhesive sheet (optical clear adhesive) may be included between the glass layer 19 and the transmittance-controlling layer 12 and metal oxide layer 14.

EXAMPLES

Hereinafter, the present invention will be described more specifically with reference to Examples and Comparative Examples; however, the present invention is never limited to the Examples.

Example 1

(Production of Transparent Conductor)

A polyethylene terephthalate film with a thickness of 50 μm (manufactured by TORAY INDUSTRIES, INC., product number: UH13, refractive index: 1.61) was prepared. The PET film was used as the transparent resin substrate. A coating material for producing the hardcoat layer on the back surface of the PET film was prepared by using the following procedure.

The following raw materials were prepared.
colloidal silica modified with reactive groups (dispersion medium: propylene glycol monomethyl ether acetate, nonvolatile content: 40% by mass): 100 parts by mass
dipentaerythritol hexaacrylate: 48 parts by mass
1,6-hexanediol diacrylate: 12 parts by mass
photopolymerization initiator (1-hydroxycyclohexyl phenyl ketone): 2.5 parts by mass The above raw materials were diluted with a solvent (propylene glycol monomethyl ether (PGME)) and mixed together to disperse the components in the solvent. Thereby, a coating material with a nonvolatile content (NV) of 25.5% by mass was prepared. The thus-obtained coating material was used as a coating material for production of the hardcoat layer.

The coating material for production of the hardcoat layer was applied onto one surface (back surface) of the transparent resin substrate to produce a coating film. After the solvent in the coating film was removed in a hot air drying oven set at 80° C., the coating film was irradiated for curing with an ultraviolet ray by using a UV treatment apparatus at an integrated light intensity of 400 mJ/cm$^2$. Thus, the hardcoat layer with a thickness of 1.5 μm was formed on one surface of the transparent resin substrate.

The transmittance-controlling layer, the metal layer, and the metal oxide layer were sequentially formed on the other surface (front surface) of the transparent resin substrate through DC magnetron sputtering. The transmittance-controlling layer was formed by using a ZnO—SnO$_2$ target. The composition of the target was ZnO:SnO$_2$=45:55 (mol %). The metal layer was formed by using an AgPdCu target. The composition of the target was Ag:Pd:Cu=99.0:0.5:0.5 (% by mass).

The metal oxide layer was formed by using a ZnO—Ga$_2$O$_3$—GeO$_2$ target. The composition of the target was ZnO:Ga$_2$O$_3$:GeO$_2$=81:9:10 (mol %). The composition of each layer formed was the same as the composition of the corresponding target. Thus, a laminate in which the hardcoat layer, the transparent resin substrate, the transmittance-controlling layer, the metal layer, and the metal oxide layer were laminated in the order presented was obtained.

A mask pattern was disposed on the surface of the metal oxide layer of the laminate obtained, and a resist pattern was formed through printing with a resist ink. The resist pattern obtained was dried under conditions of 100° C. for 10 minutes. Subsequently, the laminate with the resist pattern formed thereon was soaked in a PAN-based etching solution containing phosphoric acid, acetic acid, nitric acid, and hydrochloric acid to dissolve the metal oxide layer and the metal layer in a part without the resist pattern formed for removal. Finally, the resist pattern was removed with an alkali, and thus a transparent conductor of Example 1 (before formation of the glass layer) was produced. This transparent conductor included the first laminate part 10a and the second laminate part 20a as illustrated in FIG. 2. The composition, thickness, and refractive index of each residual layer were as shown in Table 1.

(Evaluation of Transparent Conductor 1)

For the transparent conductor obtained, the transmittances of the first laminate part 10a and the second laminate part 20a in the direction of lamination, T1 and T2, were measured by using a hazemeter (trade name: NDH-7000, manufactured by NIPPON DENSHOKU INDUSTRIES CO., LTD.). In addition, the value of the difference in transmittance (T2−T1) was calculated. These results were as shown in Table 1.

(Formation of Glass Layer)

An OCA (Optical Clear Adhesive) as a film-shaped pressure-sensitive adhesive sheet was pasted on the transmittance-controlling layer and the metal oxide layer of the above-described laminate with a pattern formed thereon through etching. On the OCA, a glass sheet was pasted. The thickness and refractive index of the glass layer (glass sheet) formed were 1 mm and 1.45, respectively. Thereby, a transparent conductor (with the glass layer) including the third laminate part 30a and the fourth laminate part 40a as illustrated in FIG. 6 was obtained.

(Evaluation of Transparent Conductor 2)

For the transparent conductor obtained, the transmittances of the third laminate part 30a and the fourth laminate part 40a in the direction of lamination, T3 and T4, were measured by using a hazemeter (trade name: NDH-7000, manufactured by NIPPON DENSHOKU INDUSTRIES CO., LTD.). In addition, the absolute value of T4−T3 was calculated. These results were as shown in Table 1.

Example 2

Transparent conductors (without the glass layer, with the glass layer) were produced in the same manner as in Example 1, except that the thickness of each of the transmittance-controlling layer and the metal oxide layer was changed as shown in Table 1, a ZnO—In$_2$O$_3$—TiO$_2$—SnO$_2$ target was used in formation of the metal oxide layer, and the high refractive index layer was formed between the transparent resin substrate and the transmittance-controlling layer. The composition of the target used for formation of the metal oxide layer was ZnO:In$_2$O$_3$:TiO$_2$:SnO$_2$=44:26:11:19 (mol %). The composition of the metal oxide layer formed was the same as the composition of the corresponding target. The composition, thickness, and refractive index of each layer are shown in Table 1.

The high refractive index layer was formed by using the following procedure. A resin composition containing zirconium oxide (ZrO$_2$) (trade name: TYZ70, manufactured by TOYO INK CO., LTD., refractive index: 1.70) was diluted with propylene glycol monomethyl ether (PGME) as a solvent to prepare a coating material with a nonvolatile content (NV) of 6% by mass. The coating material prepared was applied onto the other surface (front surface) of the transparent resin substrate to form the high refractive index layer. Thereafter, the transmittance-controlling layer, the metal layer, and the metal oxide layer were sequentially formed on the high refractive index layer formed in the same manner as in Example 1. The transparent conductor (without the glass layer) of Example 2 included the first laminate part 10b and the second laminate part 20b as illustrated in FIG. 3. The transparent conductor (with the glass layer) of Example 2 included the third laminate part 30b and the fourth laminate part 40b as illustrated in FIG. 7. Evaluations 1 and 2 were performed in the same manner as in Example 1. The evaluation results were as shown in Table 1.

TABLE 1

|  |  | Example 1 | | Example 2 | |
| --- | --- | --- | --- | --- | --- |
|  |  | First laminate part | Second laminate part | First laminate part | Second laminate part |
| Metal oxide layer | Composition | none | *1 | none | *2 |
|  | Thickness (nm) |  | 50 |  | 40 |
|  | Refractive index |  | 2.0 |  | 2.1 |
| Metal layer | Thickness (nm) | none | 5 | none | 5 |
| Transmittance-controlling layer | Composition | ZnO—SnO$_2$ | | ZnO—SnO$_2$ | |
|  | Thickness (nm) | 40 | | 50 | |
|  | Refractive index | 2.0 | | 2.0 | |
| High refractive index layer | Thickness (nm) | None | | 70 | |
|  | Refractive index |  | |  1.70 | |
| Transmittance (T1, T2) | % | 83.8 | 89.3 | 83.9 | 89.0 |
| T2 − T1 | % | 5.5 | | 5.1 | |

TABLE 1-continued

|  |  | Example 1 | | Example 2 | |
| --- | --- | --- | --- | --- | --- |
|  |  | Third laminate part | Fourth laminate part | Third laminate part | Fourth laminate part |
| Transmittance (T3, T4) | % | 89.0 | 89.1 | 89.2 | 88.4 |
| \|T4 − T3\| | % | 0.1 | | 0.8 | |

In the table, *1 is $ZnO\text{-}Ga_2O_3\text{-}GeO_2$, and *2 is $ZnO\text{-}InO_2\text{-}TiO_2\text{-}SnO_2$.

Example 3

Transparent conductors (without the glass layer, with the glass layer) were produced in the same manner as in Example 2, except that the thickness of each of the transmittance-controlling layer and the high refractive index layer was changed as shown in Table 2, and the low refractive index layer was formed between the transparent resin substrate and the high refractive index layer. The composition, thickness, and refractive index of each layer are shown in Table 2.

The low refractive index layer was formed by using the following procedure. A resin composition containing silicon oxide ($SiO_2$) (trade name: ENS653, manufactured by DIC Corporation, refractive index: 1.45) was diluted with propylene glycol monomethyl ether (PGME) as a solvent to prepare a coating material with a nonvolatile content (NV) of 3% by mass. The coating material prepared was applied onto the other surface (front surface) of the transparent resin substrate to form the low refractive index layer. Thereafter, the high refractive index layer, the transmittance-controlling layer, the metal layer, and the metal oxide layer were sequentially formed on the low refractive index layer formed in the same manner as in Example 2. The transparent conductor (without the glass layer) of Example 3 included the first laminate part 10c and the second laminate part 20c as illustrated in FIG. 4. Evaluations 1 and 2 were performed in the same manner as in Example 2. The evaluation results were as shown in Table 2.

TABLE 2

|  |  | Example 3 | |
| --- | --- | --- | --- |
|  |  | First laminate part | Second laminate part |
| Metal oxide layer | Composition | none | *2 |
|  | Thickness (nm) |  | 40 |
|  | Refractive index |  | 2.1 |
| Metal layer (nm) | Thickness | none | 5 |
| Transmittance-controlling layer | Composition | | $ZnO\text{—}SnO_2$ |
|  | Thickness (nm) | | 40 |
|  | Refractive index | | 2.0 |
| High refractive index layer | Thickness (nm) | | 50 |
|  | Refractive index | | 1.68 |
| Low refractive index layer | Thickness (nm) | | 100 |
|  | Refractive index | | 1.50 |
| Transmittance (T1, T2) | % | 82.0 | 87.9 |
| T2 − T1 | % | 5.9 | |

TABLE 2-continued

|  |  | Example 3 | |
| --- | --- | --- | --- |
|  |  | Third laminate part | Fourth laminate part |
| Transmittance (T3, T4) | % | 88.3 | 87.7 |
| \|T4 − T3\| | % | 0.6 | |

In the table, *2 is $ZnO\text{-}InO_2\text{-}TiO_2\text{-}SnO_2$.

Comparative Example 1

The hardcoat layer with a thickness of 1.5 μm was formed on one surface (back surface) of the transparent resin substrate in the same manner as in Example 1.

The transmittance-controlling layer, the metal layer, and the metal oxide layer were sequentially formed on the other surface (front surface) of the transparent resin substrate through DC magnetron sputtering. The transmittance-controlling layer and the metal oxide layer were formed by using a $ZnO\text{—}Ga_2O_3\text{—}GeO_2$ target. The composition of the target was $ZnO\text{:}Ga_2O_3\text{:}GeO_2=81\text{:}9\text{:}10$ (mol %). The metal layer was formed by using an AgPdCu target. The composition of the target was Ag:Pd:Cu=99.0:0.5:0.5 (% by mass). The composition of each layer formed was the same as the composition of the corresponding target.

Thus, a laminate in which the hardcoat layer, the transparent resin substrate, the transmittance-controlling layer, the metal layer, and the metal oxide layer were laminated in the order presented was obtained.

For the laminate obtained, a resist pattern was formed in the same manner as in Example 1, and etching was performed. Thereby, the metal oxide layer, the metal layer, and the transmittance-controlling layer in a part without the resist pattern formed were dissolved for removal. Thus, a transparent conductor (without the glass layer) of Comparative Example 1 was produced. This transparent conductor included a first laminate part including the hardcoat layer and the transparent resin substrate in the order presented, and a second laminate part including the hardcoat layer, the transparent resin substrate, the transmittance-controlling layer, the metal layer, and the metal oxide layer in the order presented. The composition, thickness, and refractive index of each layer were as shown in Table 3.

Evaluation 1 was performed for the transparent conductor (without the glass layer) in the same manner as in Example 1. Further, a transparent conductor (with the glass layer) was produced by forming the glass layer in the same manner as in Example 1. Then, Evaluation 2 was performed in the same manner as in Example 1. The evaluation results were as shown in Table 3.

Comparative Example 2

Transparent conductors (without the glass layer, with the glass layer) were produced in the same manner as in Comparative Example 1, except that the thickness of each of the metal oxide layer and the transmittance-controlling layer was changed as shown in Table 3, a $ZnO\text{—}In_2O_3\text{—}TiO_2\text{—}SnO_2$ target was used in formation of the metal oxide layer and the transmittance-controlling layer, and the high refractive index layer was formed between the transparent resin substrate and the transmittance-controlling layer. The composition of the target used for formation of the metal oxide layer and the transmittance-controlling layer was $ZnO\text{:}In_2O_3\text{:}TiO_2\text{:}SnO_2=44\text{:}26\text{:}11\text{:}19$ (mol %). The composition of each of the metal oxide layer and the transmittance-controlling layer formed was the same as the composition of the corresponding target.

The transparent conductor (without the glass layer) of Comparative Example 2 included a first laminate part including the hardcoat layer, the transparent resin substrate, and the high refractive index layer in the order presented, and a second laminate part including the hardcoat layer, the transparent resin substrate, the high refractive index layer, the transmittance-controlling layer, the metal layer, and the metal oxide layer in the order presented. The transparent conductor (with the glass layer) of Comparative Example 2 included the glass layer above the first laminate part and the second laminate part. The composition, thickness, and refractive index of each layer were as shown in Table 3.

Evaluations 1 and 2 were performed for the transparent conductors (without the glass layer, with the glass layer) in the same manner as in Example 1. The evaluation results were as shown in Table 3.

TABLE 3

|  |  | Comparative Example 1 | | Comparative Example 2 | |
|---|---|---|---|---|---|
|  |  | First laminate part | Second laminate part | First laminate part | Second laminate part |
| Metal oxide layer | Composition | none | *1 | none | *2 |
|  | Thickness (nm) |  | 50 |  | 40 |
|  | Refractive index |  | 2.0 |  | 2.1 |
| Metal layer | Thickness (nm) | none | 5 | none | 5 |
| Transmittance-controlling layer | Composition | none | *1 | none | *2 |
|  | Thickness (nm) |  | 40 |  | 50 |
|  | Refractive index |  | 2.0 |  | 2.1 |
| High refractive index layer | Thickness (nm) | none | | 70 | |
|  | Refractive index |  | | 1.70 | |
| Transmittance (T1, T2) | % | 93.8 | 90.6 | 90.3 | 88.5 |
| T2 − T1 | % | 3.2 | | 1.8 | |

|  |  | Third laminate part | Fourth laminate part | Third laminate part | Fourth laminate part |
|---|---|---|---|---|---|
| Transmittance (T3, T4) | % | 93.6 | 89.1 | 91.5 | 88.1 |
| \|T4 − T3\| | % | 4.5 | | 3.4 | |

In the table, *1 is $ZnO$-$Ga_2O_3$-$GeO_2$, and *2 is $ZnO$-$In_2O_3$-$TiO_2$-$SnO_2$.

Comparative Example 3

Transparent conductors (without the glass layer, with the glass layer) were produced in the same manner as in Example 3, except that a $ZnO$—$In_2O_3$—$TiO_2$—$SnO_2$ target was used in formation of the transmittance-controlling layer. The composition of the target used for formation of the transmittance-controlling layer was $ZnO:In_2O_3:TiO_2:SnO_2$=44:26:11:19 (mol %). The composition of the transmittance-controlling layer formed was the same as the composition of the corresponding target.

The transparent conductor (without the glass layer) of Comparative Example 3 included a first laminate part including the hardcoat layer, the transparent resin substrate, the low refractive index layer, and the high refractive index layer in the order presented, and a second laminate part including the hardcoat layer, the transparent resin substrate, the low refractive index layer, the high refractive index layer, the transmittance-controlling layer, the metal layer, and the metal oxide layer in the order presented. The transparent conductor (with the glass layer) of Comparative Example 3 included the glass layer above the first laminate part and the second laminate part. The composition, thickness, and refractive index of each layer were as shown in Table 4.

Evaluations 1 and 2 were performed for the transparent conductors (without the glass layer, with the glass layer) in the same manner as in Example 3. The evaluation results were as shown in Table 4.

Comparative Example 4

Transparent conductors (without the glass layer, with the glass layer) were produced in the same manner as in Example 1, except that the thickness of the transmittance-controlling layer was changed as shown in Table 4, and the high refractive index layer was formed between the transparent resin substrate and the transmittance-controlling layer. The high refractive index layer was formed in the same manner as in Example 2.

The transparent conductor (without the glass layer) of Comparative Example 4 included a first laminate part including the hardcoat layer, the transparent resin substrate, and the high refractive index layer in the order presented, and a second laminate part including the hardcoat layer, the transparent resin substrate, the high refractive index layer, the transmittance-controlling layer, the metal layer, and the metal oxide layer in the order presented. The transparent conductor (with the glass layer) of Comparative Example 4 included the glass layer above the first laminate part and the second laminate part. The composition, thickness, and refractive index of each layer were as shown in Table 4.

Evaluations 1 and 2 were performed for the transparent conductors (without the glass layer, with the glass layer) in the same manner as in Example 1. The evaluation results were as shown in Table 4.

TABLE 4

|  |  | Comparative Example 3 | | Comparative Example 4 | |
|---|---|---|---|---|---|
|  |  | First laminate part | Second laminate part | First laminate part | Second laminate part |
| Metal oxide layer | Composition | none | *2 | none | *1 |
|  | Thickness (nm) |  | 40 |  | 50 |
|  | Refractive index |  | 2.1 |  | 2.0 |
| Metal layer | Thickness (nm) | none | 5 | none | 5 |
| Transmittance-controlling layer | Composition | none | *2 | none | $ZnO$—$SnO_2$ |
|  | Thickness (nm) |  | 40 |  | 70 |
|  | Refractive index |  | 2.1 |  | 2.0 |
| High refractive index layer | Thickness (nm) | 50 | | 70 | |
|  | Refractive index | 1.68 | | 1.70 | |
| Low refractive index layer | Thickness (nm) | 100 | | none | |
|  | Refractive index | 1.50 | | | |

TABLE 4-continued

|  |  | Comparative Example 3 | | Comparative Example 4 | |
|---|---|---|---|---|---|
| Transmittance (T1, T2) | % | 87.8 | 88.2 | 82.5 | 84.1 |
| T2 − T1 | % | 0.4 | | 1.6 | |
|  |  | Third laminate part | Fourth laminate part | Third laminate part | Fourth laminate part |
| Transmittance (T3, T4) | % | 90.8 | 87.9 | 88.9 | 84.3 |
| |T4 − T3| | % | 2.9 | | 4.6 | |

In the table, *1 is ZnO-Ga2O3-GeO2, and *2 is ZnO-InO2-TiO2-SnO2.

As shown in Tables 1 to 4, it was confirmed for each Example that use of the transparent conductor (without the glass layer) with a difference in transmittance between the first laminate part and the second laminate part (T2–T1) of 4% or less can provide a sufficiently small absolute value of the difference between the transmittance of the third laminate part corresponding to an insulating part, T3, and the transmittance of the fourth laminate part corresponding to a conductive part, T4. Such a transparent conductor can sufficiently reduce shading due to the difference in transmittance.

INDUSTRIAL APPLICABILITY

The present disclosure can provide a transparent conductor capable of sufficiently preventing generation of shading due to the difference in transmittance between a conductive part and an insulating part, and a method for producing the same. In addition, the present disclosure can provide a touch panel with shading due to the difference in transmittance between a conductive part and an insulating part sufficiently reduced by using such a transparent conductor.

REFERENCE SIGNS LIST

10, 10a, 10b, 10c: first laminate part, 11: transparent resin substrate, 12: transmittance-controlling layer, 13: high refractive index layer, 14: metal oxide layer, 15a, 15b: sensor electrode, 16: metal layer, 17: low refractive index layer, 18: hardcoat layer, 19: glass layer, 20, 20a, 20b, 20c: second laminate part, 30, 30a, 30b, 30c: third laminate part, 40, 40a, 40b, 40c: fourth laminate part, 50: conductor line, 70: panel sheet, 76: cover glass, 80: electrode, 90: adhesive, 92: spacer, 100, 101, 102, 103, 104, 105, 106, 107: transparent conductor, 100a, 100b: sensor film, 200: touch panel.

The invention claimed is:

1. A transparent conductor comprising a transparent resin substrate, wherein the transparent conductor comprises:
    a first laminate part including the transparent resin substrate and a transmittance-controlling layer; and
    a second laminate part including the transparent resin substrate, the transmittance-controlling layer, a metal layer containing silver or a silver alloy, and a metal oxide layer in the order presented,
    the first laminate part and the second laminate part are adjacent to each other in a direction perpendicular to a direction of lamination of the first laminate part and the second laminate part, and
    difference between transmittance of the first laminate part in the direction of lamination, T1, and transmittance of the second laminate part in the direction of lamination, T2, (T2−T1) is 4% or more.

2. The transparent conductor according to claim 1, wherein the T2 is 80% or higher.

3. The transparent conductor according to claim 1 wherein
    a refractive index of the transmittance-controlling layer is 1.8 to 2.5, and
    a refractive index of the metal oxide layer is 1.8 to 2.3.

4. The transparent conductor according to claim 1 wherein
    the first laminate part and the second laminate part each include a high refractive index layer between the transparent resin substrate and the transmittance-controlling layer, and
    a refractive index of the high refractive index layer is 1.55 to 1.8.

5. The transparent conductor according to claim 1, wherein
    the first laminate part and the second laminate part each include, between the transparent resin substrate and the transmittance-controlling layer, a low refractive index layer and a high refractive index layer in the order presented from a transparent resin substrate side,
    a refractive index of the high refractive index layer is 1.55 to 1.8, and
    a refractive index of the low refractive index layer is lower than the refractive index of the high refractive index layer and is 1.4 to 1.6.

6. The transparent conductor according to claim 1, wherein the first laminate part and the second laminate part each include a hardcoat layer in a side opposite to a transmittance-controlling layer side of the transparent resin substrate.

7. The transparent conductor according to claim 1, wherein
    the transmittance-controlling layer contains at least one of zinc oxide and tin oxide, and
    the metal oxide layer has a composition different from a composition of the transmittance-controlling layer, and contains at least one selected from the group consisting of zinc oxide, gallium oxide, germanium oxide, indium oxide, titanium oxide, and tin oxide.

8. The transparent conductor according to claim 1, wherein
    the first laminate part and the second laminate part each include a glass layer in a side opposite to a transparent resin substrate side,
    transmittance of a third laminate part including the first laminate part and the glass layer in the direction of lamination, T3, is 90% or lower, and
    transmittance of a fourth laminate part including the second laminate part and the glass layer in the direction of lamination, T4, is 85% or higher.

9. A transparent conductor comprising a transparent resin substrate, wherein
    the transparent conductor is obtained by etching a laminate including the transparent resin substrate, a transmittance-controlling layer, a metal layer containing silver or a silver alloy, and a metal oxide layer in the order presented to remove a part of the metal layer and the metal oxide layer, without removing the transmittance-controlling layer,
    the transparent conductor comprises a first laminate part including the transparent resin substrate and a transmittance-controlling layer and a second laminate part including the transparent resin substrate, the transmittance-controlling layer, a metal layer containing silver or a silver alloy, and a metal oxide layer in the order presented, and the first laminate part and the second laminate part are adjacent to each other in a direction perpendicular to a direction of lamination of the first laminate part and the second laminate part.

10. A transparent conductor comprising a transparent resin substrate, wherein the transparent conductor comprises:
   a third laminate part including the transparent resin substrate, a transmittance-controlling layer, and a glass layer in the order presented; and
   a fourth laminate part including the transparent resin substrate, the transmittance-controlling layer, a metal layer containing silver or a silver alloy, a metal oxide layer, and the glass layer in the order presented,
   the third laminate part and the fourth laminate part are adjacent to each other in a direction perpendicular to a direction of lamination of the third laminate part and the fourth laminate part,
   transmittance of the third laminate part in the direction of lamination, T3, is 90% or lower, and
   transmittance of the fourth laminate part in the direction of lamination, T4, is 85% or higher.

11. The transparent conductor according to claim 8, wherein an absolute value of difference between the transmittance T3 and the transmittance T4 (T4−T3) is 1% or less.

12. A transparent conductor comprising a transparent resin substrate, wherein the transparent conductor comprises:
   a third laminate part including the transparent resin substrate, a transmittance-controlling layer, and a glass layer in the order presented; and
   a fourth laminate part including the transparent resin substrate, the transmittance-controlling layer, a metal layer containing silver or a silver alloy, a metal oxide layer, and the glass layer in the order presented,
   the third laminate part and the fourth laminate part are adjacent to each other in a direction perpendicular to a direction of lamination of the third laminate part and the fourth laminate part, and
   the transmittance-controlling layer is an insulating layer.

13. A touch panel comprising one or more sensor films on a panel sheet, wherein
   at least one of the sensor films is configured with the transparent conductor according to claim 1.

14. A method for producing the transparent conductor according to claim 1, the method comprising:
   a step of etching a laminate including the transparent resin substrate, the transmittance-controlling layer, the metal layer, and the metal oxide layer in the order presented to remove a part of the metal layer and the metal oxide layer, without removing the transmittance-controlling layer, for formation of the first laminate part and the second laminate part.

15. The transparent conductor according to claim 2, wherein
   the first laminate part and the second laminate part each include, between the transparent resin substrate and the transmittance-controlling layer, a low refractive index layer and a high refractive index layer in the order presented from a transparent resin substrate side,
   a refractive index of the high refractive index layer is 1.55 to 1.8, and
   a refractive index of the low refractive index layer is lower than the refractive index of the high refractive index layer and is 1.4 to 1.6.

16. The transparent conductor according to claim 10, wherein an absolute value of difference between the transmittance T3 and the transmittance T4 (T4−T3) is 1% or less.

17. A touch panel comprising one or more sensor films on a panel sheet, wherein
   at least one of the sensor films is configured with the transparent conductor according to claim 9.

18. A touch panel comprising one or more sensor films on a panel sheet, wherein
   at least one of the sensor films is configured with the transparent conductor according to claim 10.

19. A touch panel comprising one or more sensor films on a panel sheet, wherein
   at least one of the sensor films is configured with the transparent conductor according to claim 12.

20. A method for producing the transparent conductor according to claim 9, the method comprising:
   a step of etching a laminate including the transparent resin substrate, the transmittance-controlling layer, the metal layer, and the metal oxide layer in the order presented to remove a part of the metal layer and the metal oxide layer, without removing the transmittance-controlling layer, for formation of the first laminate part and the second laminate part.

\* \* \* \* \*